(12) United States Patent
Isazawa et al.

(10) Patent No.: US 6,539,736 B1
(45) Date of Patent: Apr. 1, 2003

(54) METHOD FOR CONTROLLING TO COOL A COMMUNICATION STATION

(75) Inventors: Kenji Isazawa, Tokyo (JP); Takashi Nonaka, Tokyo (JP); Yu Seshimo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 36 days.

(21) Appl. No.: 09/594,508

(22) Filed: Jun. 15, 2000

(30) Foreign Application Priority Data

| Aug. 26, 1999 | (JP) | ............................................. 11-239406 |
| Aug. 3, 1999 | (JP) | ............................................. 11-219661 |
| Jan. 24, 2000 | (JP) | ............................................. 12-014583 |

(51) Int. Cl.⁷ ............................................. F25B 49/00
(52) U.S. Cl. ............................................. 62/175; 62/132
(58) Field of Search ............................ 62/175, 132, 126, 62/231; 137/59; 165/200, 332, 335

(56) References Cited

U.S. PATENT DOCUMENTS

| 4,827,733 | A |   | 5/1989 | Dinh |
| 5,222,370 | A | * | 6/1993 | James ........................... 62/175 |
| 5,309,732 | A |   | 5/1994 | Sami |
| 5,351,498 | A | * | 10/1994 | Takahashi et al. .............. 62/99 |
| 5,499,510 | A | * | 3/1996 | Yoshida et al. ................ 62/175 |
| 5,630,324 | A | * | 5/1997 | Yoshida et al. ................ 62/175 |
| 5,642,857 | A | * | 7/1997 | Totsuka et al. ................ 236/51 |
| 5,655,381 | A |   | 8/1997 | Huttenlocher et al. |
| 5,709,100 | A | * | 1/1998 | Baer et al. ................... 62/259.2 |
| 5,743,101 | A | * | 4/1998 | Shida et al. ................... 62/175 |
| 5,806,583 | A |   | 9/1998 | Suzuki et al. |
| 6,044,652 | A | * | 4/2000 | Nishihara et al. .............. 62/175 |

FOREIGN PATENT DOCUMENTS

| DE | 92 05 991 | 7/1992 |
| DE | 196 09 651 | 9/1997 |
| GB | 2 300 910 | 11/1996 |
| JP | 8-88493 | 4/1996 |
| JP | 9-159210 | 6/1997 |
| JP | 9-264679 | 10/1997 |
| JP | 11-135972 | 5/1999 |
| JP | 11-182910 | 7/1999 |

* cited by examiner

*Primary Examiner*—Teresa Walberg
*Assistant Examiner*—Daniel Robinson
(74) *Attorney, Agent, or Firm*—Oblon, Spivak, McClelland, Maier & Neustadt, P.C.

(57) ABSTRACT

A cooling system for a communication station for cooling a casing of the communication relay station, accommodating communication equipments including heat components, by a boiling-type cooler in a natural circulation refrigerating circuit and an evaporator in a forced circulation refrigerating circuit, activated by a compressor comprising:

a common airflow path having a heated air intake port for taking a heated air in the casing; and a common fan for sending an air to the boiling-type cooler and the evaporator, wherein the boiling-type cooler, the evaporator, and the common fan are built in a common airflow path.

14 Claims, 32 Drawing Sheets

Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
w: OUTPUT FROM ELECTRIC POWER DETECTING MANS 12
f(w): MAXIMUM FREQUENCY OPERATING FUNCTION HAVING VARIABLE w
Ws: PREVIOUSLY SET VALUE OF ELECTRIC POWER CONSUMPTION Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
w: OUTPUT FROM ELECTRIC POWER DETECTING MANS 12

Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
Tin: SUCTION TEMPERATURE
f(Tin): MAXIMUM FREQUENCY OPERATING FUNCTION HAVING VARIABLE Tin Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
$f(Tin)$: MAXIMUM FREQUENCY OPERATING FUNCTION HAVING VARIABLE Tin
Tin: SUCTION TEMPERATURE
Tins: SET VALUE OF SUCTION TEMPERATURE Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
w: OUTPUT FROM ELECTRIC POWER DETECTING MANS 12
Ws: PREVIOUSLY SET VALUE OF ELECTRIC POWER CONSUMPTION Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
w: OUTPUT FROM ELECTRIC POWER DETECTING MANS 12
f(w): MAXIMUM FREQUENCY OPERATING FUNCTION HAVING VARIABLE w
Tin: SUCTION TEMPERATURE
Tins: SET VALUE OF SUCTION TEMPERATURE SENSIBLE COOLING CAPABILITY (kW)

SUCTION TEMPERATURE INTO AIR CONDITIONER

FIG. 21 (CONTINUED)

*1  SUCTION TEMPERATURE INITIAL TARGET VALUE Tinso
   READING SUCTION TEMPERATURE INITIAL TARGET VALUE Tso FOR COMMUNICATION EQUIPMENT FROM VARIOUS SETTING MEANS
   LOWER LIMIT VALUE OF SUCTION TEMPERATURE TARGET VALUE: Tinsmin
   LOWER LIMIT VALUE OF SUCTION TEMPERATURE TARGET VALUE FOR COMMUNICATION EQUIPMENT: Tsmin
   UPPER LIMIT VALUE: Tsmax

*2  DIRECTING SUCTION TEMPERATURE TARGET VALUE Ts FOR COMMUNICATION EQUIPMENT TO AIR CONDITION CONTROL MEANS

*3  RESETTING 10 MINUTE TIMER, START (T2=0) Flag1=0 Flag2=0

*4  MEASURING AND MEMORIZING Tin, Tm BY EACH MINUTE
   DETECTING THERMO-ON OF AIR CONDITIONER AND MEMORIZING NUMBER OF THERMO-ONS

*5  MEASURED Tm ONCE EXCEEDS 36°C IN PAST 10 MINUTES

*6  MEASURING SUCTION TEMPERATURE AND CALCULATE AVERAGE VALUE In 10 MINUTES (Tin10)

Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
w: OUTPUT FROM ELECTRIC POWER DETECTING MANS 12
f(w): MAXIMUM FREQUENCY OPERATING FUNCTION HAVING VARIABLE w
Tin: SUCTION TEMPERATURE
Tins: SET VALUE OF SUCTION TEMPERATURE Tm: TEMPERATURE OF SUCTION AIR 8 FOR COMMUNICATION EQUIPMENT
Ts: SET TEMPERATURE OF SUCTION AIR 8 FOR COMMUNICATION EQUIPMENT
$\Delta f$: PREVIOUSLY SET VARIATION OF FREQUENCY
w: OUTPUT FROM ELECTRIC POWER DETECTING MANS 12

METHOD FOR CONTROLLING TO COOL A COMMUNICATION STATION

BACKGROUND OF THE INVENTION

1. Field of the Invention

The present invention relates to a method for controlling to cool a communication station, wherein an inside of the communication station, accommodating communication equipments including heat elements such as boards, are cooled by a cooling device such as an air conditioner.

The present invention also relates to an improvement of a system for cooling a casing of a communication station, wherein an inside of the casing, accommodating communication equipments including heat components, is cooled by a boiling type cooler in a natural circulation refrigerating circuit and an evaporator in a forced circulation refrigerating circuit, circulated by a compressor.

2. Discussion of Background

In recent years, communication stations including a large number of electronical boards for communication are located in various places for relaying communications along with expanding popularization of portable communication apparatuses. Dimensions of such communication relay stations are, for example, a width of about 6 m, a depth of about 1.7 m, and a height of about 1.7 m. Although the communication relay stations are relatively small, a gloss colorific value of electronical boards, equipped in the communication stations, are several kW through several dozens of kW. Therefore, air conditioners are used to cool these electronic boards by cooling board casings of the communication stations. FIG. 33 illustrates a structure of a conventional method for controlling to cool a communication station. In FIG. 33, numerical reference 1 designates a rack accommodating a communication equipments including a large number of electronic boards and so on; numerical reference 3 designates a fan; numerical reference 4 designates an indoor unit including an indoor heat exchanger 4a and an indoor fan 4b; numerical reference 5 designates an outdoor unit including a compressor 5a and an outdoor heat exchanger 5b; numerical reference 6 designates a suction air into the indoor heat exchanger 4a; numerical reference 7 designates a blown-out air from the indoor heat exchanger 4a; numerical reference 8 designates a suction air for cooling the communication equipment 2; numerical reference 9 designates a suction air temperature detector for detecting a temperature of the suction air 6; numerical reference 10 designates a casing for accommodating the lack 1 and the indoor unit 4; and numerical reference 11 designates a cooling controller for controlling a cooling capability of the compressor 5a.

In the next, an operation of the conventional method for controlling to cool the communication station will be described. The number of operating communication equipments 2 is changed in response to a frequency of communication, and a colorific value is increased or decreased in response to the number of operating communication equipments 2. The suction air 8 to the communication equipments 2 is sent by the fan 3 to cool the communication equipments 2, is heated after cooling, and is taken in the indoor unit 4 as the suction air 6 into the indoor heat exchanger 4a. The suction air 6, taken into the indoor unit 4, is cooled by the indoor heat exchanger 4a, is blown out into the casing 10 as the blown-out air 7 from the indoor heat exchanger 4a, and is served as the suction air 8 into the communication equipments 2. On the other hand, the cooling controller 11 controls a cooling capability of the compressor 5a based on an output temperature of the suction air temperature detector 9 so that the suction air 8 into the communication equipments 2 becomes a predetermined temperature, for example, 35° C. or less.

Further, a large number of communication stations for handy personal phones and so on are located in cities, rooftops of condominiums and office buildings, mountain tops in the suburbs, and wilds. Communication equipments are generally accommodated in a sealed casing in the communication stations. However, some of casings have a space too narrow to receive a person. Therefore, the casings are adequately cooled because heat components are included in the communication equipments.

As a system for cooling such a casing is disclosed in Japanese Unexamined Patent Publication JP-A-11-135972. FIG. 34 illustrates this system. The casing cooling system 151 for a communication station 152 is composed of a boiling type cooler 121 in a natural circulation refrigerating circuit 120 and an evaporator 113 in a forced circulation refrigerating circuit 109 so as to cool an inside of the casing 103 as the sealed space. The forced circulation refrigerating circuit 109 is constructed to forcibly circulate a refrigerant by a compressor 110, which mechanism is generally used in an air conditioner and so on. Communication equipments 104 including heat components 105 are accommodated in the casing 103. In generally used communication equipments 104, a fan (not shown) is located inside an equipment case 106 having built-in heat components 105 to take an air from an intake port 107, located on a side surface or a bottom surface of the equipment case, and to blow a heat out of an exhaust port 108, positioned on a back of the equipment case.

In a case of an evaporator, an intake port 155 for taking an air inside the casing 103 and an exhaust port for blowing a cooled air into the casing 103 are formed. In the case 153 of the evaporator, the evaporator 113 and a fan 154 are built. On the other hand, on a back surface of the equipment case 106, a heated air guide path 157, connected to the exhaust port 108, is formed. The heated air guide path 157 is connected to an air path 167 having a heated air intake port and a heated air exhaust port. A condenser 122 and a fan 163 are built in the air path 167.

A condenser 111 in the force circulation refrigerating circuit 109 is located in a case of a condenser as an outdoor unit of an air conditioner. The case 117 of the condenser is formed like a box having an outer air intake port 118 and an exhaust port 119. The condenser 111, the compressor 110, a choke valve 112 for refrigerant, and a fan 116 are housed in the case 117 of the condenser. The forced circulation refrigerating circuit 109 is constructed by sequentially connecting the compressor 110, the condenser 111, the refrigerant choke valve 112 in the condenser case 117 with the evaporator 113 in the casing 103 via tubes 114, 115 for the refrigerant so as to be shaped like a ring. Further, the condenser 122 in the natural circulation refrigerating circuit 120 is disposed in the condenser case 159 as an outdoor unit. The condenser case 159 is shaped like a box having an outer air intake port 160, an exhaust port 161, the condenser 122, the fan 162. The natural circulation refrigerating circuit 120 is constructed by connecting the condenser 122 in the condenser case 159 with the boiling type cooler 121 in the airflow path 167 via a refrigerant evaporation tube 123 and a liquid refrigerant return tube 124 so as to be shaped like a ring.

In the conventional cooling system, a cooling capability is determined in conformity with a maximum load of the heat components 105. Because the casing 103 generally has a structure having an extremely small heat transfer through solid conductors, there are very small variations of a cooling load inside the casing 103 in response to variations of an outer air temperature.

In the next, an operation of the conventional system will be described. An air in the casing 103 is taken in the equipment case 106 through the air intake port 107 when a fan in the communication equipments 104 (not shown) is driven. A cooling air, taken in, cools the heat components 105 and is changed to be a heated air. Thereafter, the heated air is blown out of the exhaust port 108 in the back surface of the case into the heated air guide path 157. Thus blown-out heated air is sucked in the airflow path 167 through the heated air intake port 158 by the fan 163. The heated air passes through the boiling type cooler 121 in the airflow path 167 and primarily cooled by changing heat with a refrigerant in the natural circulation refrigerating circuit 120. The air subjected to the primary cooling is sucked by the fan 163 and blown into the casing 103 through the exhaust port 164. At least a part of the air subjected to the primary cooling is sucked into the evaporator case 153 through the intake port 155 by the fan 154 and passes through the evaporator 113, whereby the air is cooled by changing heat with a refrigerant in the forced circulation refrigerating circuit 109. Thus cooled air is blown out of the cooling air exhaust port 156 into the casing.

In the natural circulation refrigerating circuit 120, a refrigerant in the boiling type cooler 121 is boiled by changing heat with the heated air so as to be a gas refrigerant. The gas refrigerant passes through the refrigerant evaporation tube 123 and reaches the condenser 122. The gas refrigerant in the condenser 122 is changed to a liquid refrigerant by changing heat with an outer air passing from the outer air intake port 160 to the exhaust port 161 in a condenser case 159, wherein the gas refrigerant is cooled. The liquid refrigerant returns to the boiling type cooler 121 through the liquid refrigerant return tube 124 by a gravity flow caused by a difference of weight densities between the liquid refrigerant and the gas refrigerant. On the other hand, in the forced circulation refrigerating circuit 109, a high-temperature high-pressure gas refrigerant, forcibly discharged out of the compressor 110, flows into the condenser 111 and is changed to be a liquid refrigerant by exchanging heat with an outer air flowing from the outer air intake port 118 to the exhaust port 119 in the condenser case 117 by the fan 116, wherein the high-temperature high-pressure gas refrigerant is cooled. The liquid refrigerant is depressurized by the refrigerant choke valve 12 to be a gas-liquid two-phase state. Thereafter, the liquid refrigerant reaches the evaporator 113 through the refrigerant tube 114. The refrigerant exchanges heat with an air flowing through the evaporator case 153 in the evaporator 113 so as to be a low-pressure gas refrigerant. The refrigerant returns to an intake side of the compressor 110 through the refrigerant tube 115.

In the conventional cooling control method for communication stations, because an ordinary wall-hang or dangling-type package air conditioner is used as disclosed in Japanese Unexamined Patent Publication JP-A4-98038, a suction temperature 6 of the indoor heat exchanger 4a is detected by the suction temperature detecting means 9. However, in case that an air distribution in the casing is not preferable, there occur phenomenons that exhausted heat from the communication equipments resides and an air blown out of the indoor unit causes a short cycle. Accordingly, a calorific value of the communication equipments, i.e. a real cooling load, does not in conformity with the suction air temperature 6. Accordingly, the air conditioner does not deal with the real cooling load, whereby a temperature in the casing is increased or decreased; and environmental conditions of working temperature of the communication equipments are resultantly unsatisfied, and vapor is condensed in the air conditioner.

Meanwhile, in the conventional cooling system, because the boiling type cooler 121 and the evaporator 113 are located in the different airflow paths, it is necessary to locate fans 163 and 154 respectively for the airflow paths.

Further, because a density of components installed in the casing 103 is high in order to pursue compactness, it is impossible to provide a space for additional fans. Therefore, there is a problem that a large-sized fan can. not be used, for example, a large airflow rate can not be supplied when the space of the casing 103 is unchanged.

Incidentally, because the air, primarily cooled in the boiling type cooler 121, diffuses in the casing 103 after passing through the exhaust port 164, a part of the airflows toward the evaporator case 153, like an arrow C, and the other parts are sucked in the air intake port 107 of the communication equipment 104 by bypassing like an arrow B. When an airflow rate of the fan 154 is excessively large, the cooled air, blown out of the cooling air exhaust port 156, may return to the intake port 155 by a short cycle, whereby cooling efficiency is deteriorated.

Further, in order to take the heated air in the boiling type cooler 121, it is necessary to locate the heated air guide path 157 and the heated air intake port 158, whereby a structure of airflow path becomes complicated. If the heated air guide path 157 is not located, a high-temperature heated air, blown out of the exhaust port 108 of the communication equipments 104, is directly sucked into the suction port 155 of the evaporator 113 by bypassing the boiling type cooler 121, whereby there is a danger that the forced circulation refrigerating circuit 109 is broken.

SUMMARY OF THE INVENTION

It is an object of the present invention to solve the above-mentioned problems inherent in the conventional technique and to provide a cooling control method for communication stations, by which communication equipments can be cooled in response to a variation of a calorific value, caused by the number of operations of the communication equipments. Further, it is possible to control with a good follow-up capability; a cooler can be highly efficiently operated by saving an energy; moisture condensation can be prevented; frequent turning-ons and turning-offs of an air conditioner can be prevented; it is possible to deal with environmental changes; and a COP of the cooler can also be increased; and other improvements can be obtained.

Further, another object of the present invention is to provide a cooling control method for communication stations, by which moisture condensation, caused by excessive drop of a temperature of a blowing-out air from an indoor unit can be prevented.

Another object of the present invention is to provide a cooling system for a casing of communication stations, by which a capacity of the total volume of the cooling system is optimized, an energy is saved, and reliability of the system can be improved by appropriately combining a boiling-type cooler in a natural circulation refrigerating circuit, an evaporator in a forced circulation refrigerating circuit, and fans.

According to a first aspect of the present invention, there is provided a cooling system for a communication station for cooling a casing of the communication station, accommodating communication equipments including heat components, by a boiling-type cooler in a natural circulation refrigerating circuit and an evaporator in a forced circulation refrigerating circuit, activated by a compressor comprising:

a common airflow path having a heated air intake port for taking a heated air into the casing and a cooled air exhaust port for blowing a cooled air into the casing; and a common fan for sending an air to the boiling-type cooler and the evaporator, wherein the boiling-type cooler, the evaporator, and the common fan are built in the common airflow path.

According to a second aspect of the present invention, there is provided the cooling system for the communication station, wherein the common airflow path is constructed by an air path on a cooler side, inside which the boiling-type cooler is installed, an air path on an evaporator side, in which the evaporator is installed, and a connection air path for connecting the air path on the cooler side and the air path on the evaporator side.

According to a third aspect of the present invention, there is provided the cooling system for the communication station further comprising:

a temperature detecting means for detecting at least an outer air temperature; and a compressor control means for stopping an operation of the compressor in the forced circulation refrigerating circuit based on a detected temperature received from the temperature detecting means.

According to a fourth aspect of the present invention, there is provided the cooling system for the communication station further comprising:

a malfunction detecting means for detecting malfunctions of the forced circulation refrigerating circuit; and a driving means for keeping the common fan in a running state when the malfunctions in the forced circulation refrigerating circuit are detected by the malfunction detecting means.

According to a fifth aspect of the present invention, there is provided a cooling controlling method for a communication station having an air conditioner, and a casing for accommodating communication equipments comprising:

an electric power detecting means for detecting a power consumption of the communication equipments, accommodated in the casing; a suction temperature detecting means for detecting a temperature of an air, sent to the communication equipments; and a cooling control means for controlling a capability of the air conditioner, wherein the cooling control means controls the capability of the air conditioner based on an output from the electric power detecting means and an output from the suction temperature detecting means.

According to a sixth aspect of the present invention, there is provided the cooling control method for the communication station, wherein the capability the compressor of the air conditioner is minimized in case that the output from the electric power detecting means is smaller than a predetermined electrical power by the cooling control means.

According to a seventh aspect of the present invention, there is provided a cooling control method for a communication station having a casing accommodating an air conditioner and communication equipments comprising:

a suction temperature detecting means for detecting a suction temperature of an indoor heat exchanger;

a suction temperature detecting means for detecting a temperature of an air, sent to the communication equipments; and a cooling control means for controlling a capability of the air conditioner, wherein the capability of the air conditioner is controlled based on an output from the suction temperature detecting means for the indoor heat exchanger and the suction temperature detecting means for the communication equipments by the cooling control means.

According to an eighth aspect of the present invention, there is provided the cooling control method for the communication station, wherein the capability of the compressor of the air conditioner is minimized in case that an output from the suction temperature detecting means for the indoor heat exchanger is lower than a predetermined temperature.

According to a ninth aspect of the present invention, there is provided a cooling control method for a communication station having a casing accommodating an air conditioner and communication equipments comprising:

an electric power detecting means for detecting an electric power consumption of the communication equipments, accommodated in the casing;

a suction temperature detecting means for detecting a suction temperature of an indoor heat exchanger;

a suction temperature detecting means for detecting a temperature of an air sent to the communication equipments; and a cooling control means for controlling a capability of the air conditioner, wherein the capability of the air conditioner is controlled by the cooling control means based on an output from the electric power detecting means, an output from the suction temperature detecting means for the indoor heat exchanger, and an output from the suction temperature detecting means for the communication equipments.

According to a tenth aspect of the present invention, there is provided the cooling control method for the communication station, wherein a capability of the compressor of the air conditioner is minimized in case that the output from the electric power detecting means is smaller than a predetermined electrical power, or an output from the suction temperature detecting means for the indoor heat exchanger is smaller than a predetermined temperature.

According to an eleventh aspect of the present invention, there is provided the cooling control method for the communication station, wherein the electric power consumption is detected by the electrical power detecting means based on a total electric current through the communication equipments accommodated in the casing.

According to a twelfth aspect of the present invention, there is provided a cooling control method for a communication station having a casing, accommodating an air conditioner and communication equipments comprising;

a suction temperature detecting means for detecting a temperature of an air sent to the communication equipments;

a suction temperature detecting means for detecting a temperature of a suction air into an indoor heat exchanger; and a cooling control means for controlling a capability of the air conditioner and for changing a control target value of a temperature of an air sent to the communication equipments, wherein the cooling control means controls the capability of the air conditioner based on an output from the suction temperature detecting means for the communication equipments and the control target value of the temperature of the air, sent to the communication equipments, and changes the control target value of the temperature of the air, sent to the communication equipments, based on an output from the suction temperature detecting means for the indoor heat exchanger.

According to a thirteenth aspect of the present invention, there is provided the cooling control method for the communication station, wherein the cooling control means changes the control target value of the temperature of the air, sent to the communication equipments, based on a target value of the suction air temperature into the indoor heat exchanger and the output from the suction temperature detecting means for the indoor heat exchanger, and the cooling control means decreases the target value of the suction air temperature into the indoor heat exchanger by a predetermined temperature in case that at least one of phenomenons that the suction temperature into the communication equipments, detected by the suction temperature detecting means for the communication equipments, exceeds a predetermined limit value and that the air conditioner is turned on for predetermined numbers or more.

According to a fourteenth aspect of the present invention, there is provided the cooling control method for the communication station, wherein an upper limit value and a lower limit value of the suction air temperature are controlled by the cooling control means based on the target value of the suction air temperature for the indoor heat exchanger and the control target value of the temperature of the air, sent to the communication equipments.

According to a fifteenth aspect of the present invention, there is provided the cooling control method for the communication station, wherein an initial value of the control target value is set by the cooling control means by every predetermined period.

According to a sixteenth aspect of the present invention, there is provided the cooling control method for the communication station further comprising:

an auxiliary cooling device besides the air conditioner, served as a main cooling device, wherein an operation of the auxiliary cooling device is controlled independently of the main cooling device.

According to a seventeenth aspect of the present invention, there is provided the cooling control method for the communication station further comprising:

an ebullient cooling device as an auxiliary cooling device besides the air conditioner, served as a main cooling device, and an evaporator for the ebullient cooling device located on an upstream side in an airflow path, in which the indoor heat exchanger of the main cooling device is located, wherein the main cooling device controls to cool an air, cooled by the ebullient cooling device.

According to an eighteenth aspect of the present invention, there is provided the cooling control method for the communication station, wherein a blower of an outdoor unit of the ebullient cooling device is stopped in case that the detected temperature by the suction temperature detecting means for the indoor heat exchanger is smaller than a predetermined value.

According to a nineteenth aspect of the present invention, there is provided a cooling control method for a communication station comprising:

a suction temperature detecting means for detecting a suction air temperature into an indoor heat exchanger; and a cooling control means for controlling an air conditioner based on the suction air temperature, outputted from the suction temperature detecting means and a suction air temperature, outputted from a suction temperature detecting means for communication equipments, and for controlling a cooling capability of the air conditioner in case that an electric power consumption of the communication equipments outputted from an electric power detecting means is a predetermined value or less.

According to a twentieth aspect of the present invention, there is provided a cooling control method for communication station comprising:

an electric power detecting means for detecting an electric power consumption;

a suction temperature detecting means for communication equipments; and a cooling control means for controlling an air conditioner based on outputs from the electrical power detecting means and the suction temperature detecting means, and for control a cooling capability of the air conditioner to be minimum in case that a suction temperature into an indoor unit, outputted by a suction temperature detecting means for the indoor heat exchanger, is a predetermined value or less.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

A detailed explanation will be given of preferred embodiments of the present invention in reference to FIGS. 1 through 32 as follows, wherein the same numerical references are used for the same or similar portions and description of these portions is omitted.

Embodiment 1

Figure 1:
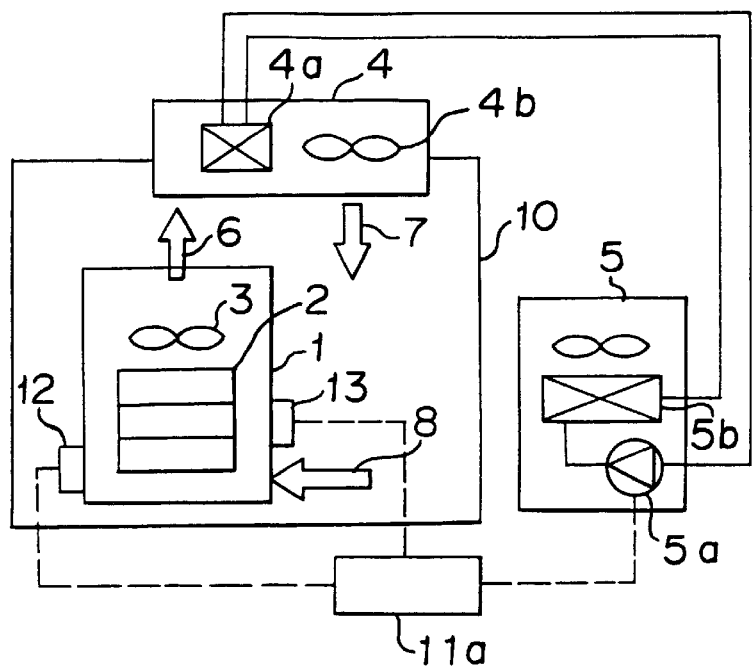
FIG. 1 illustrates a structure of a cooling control method for a communication station according to Embodiments 1 and 6 of the present invention.
Figure 2:
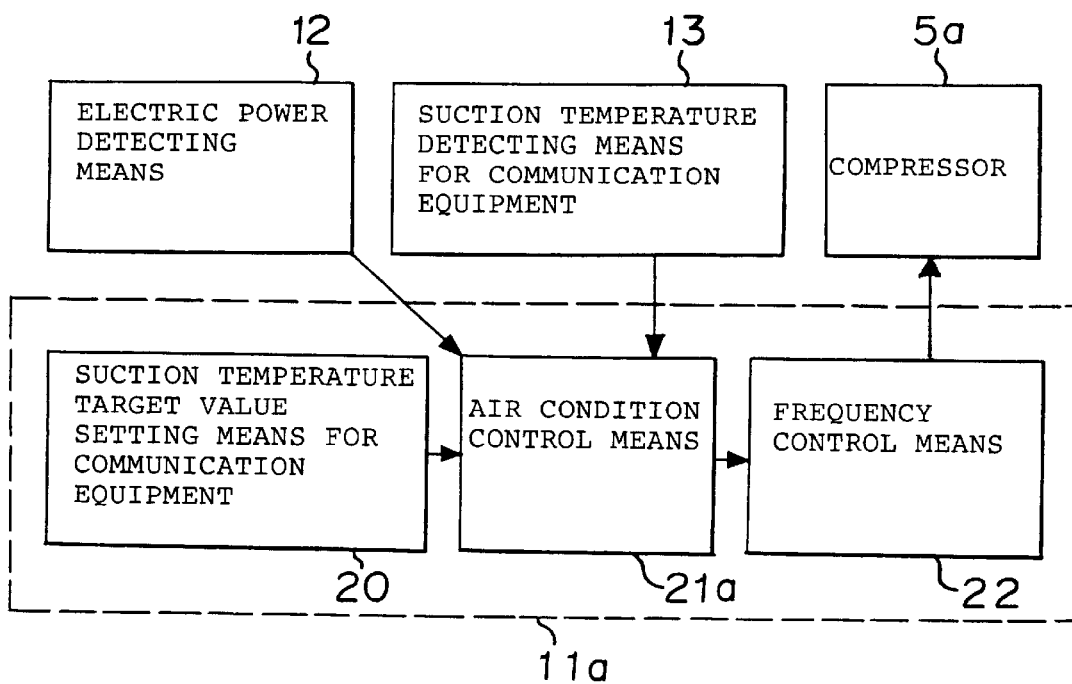
FIG. 2 is a block chart illustrating a cooling control means according to Embodiments 1 and 6 of the present invention.
Figure 33:
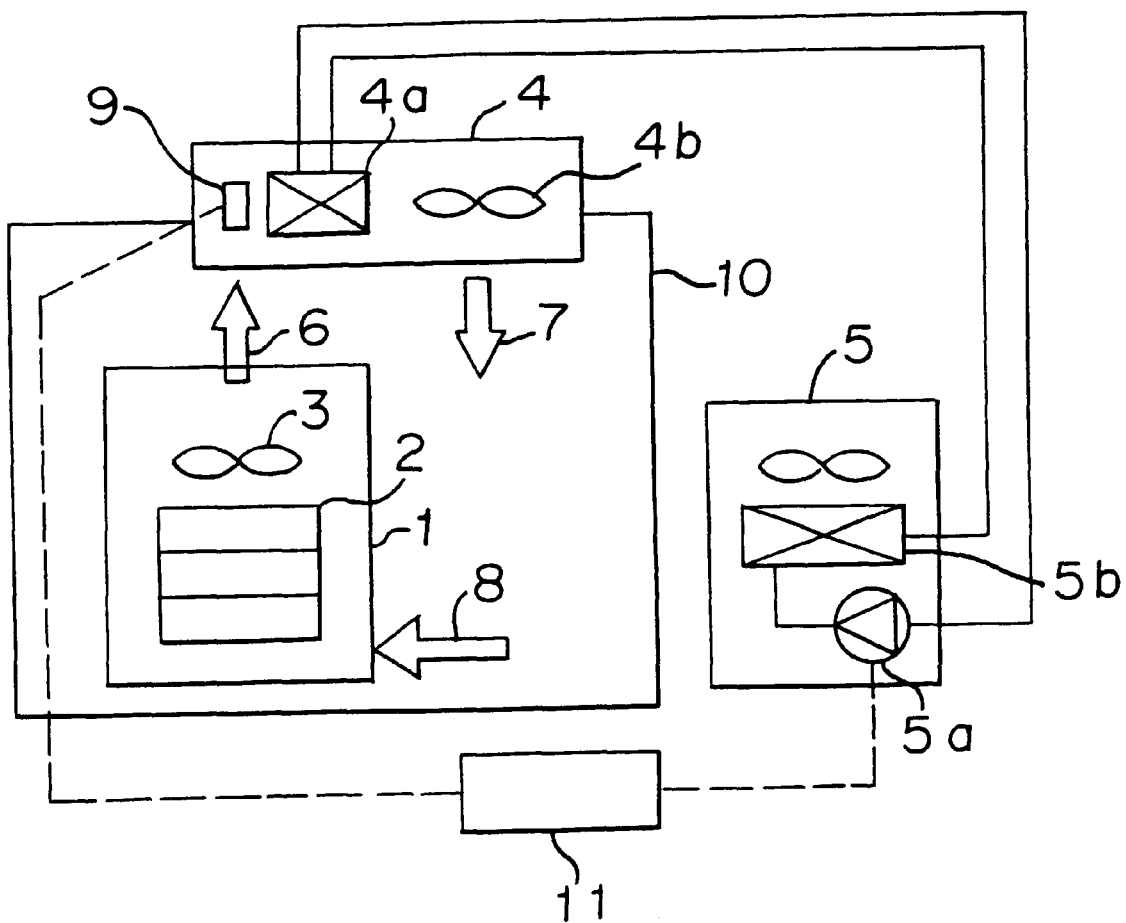
FIG. 33 illustrates a structure of a conventional cooling control method in a communication station.

An example of a cooling control method for a communication station and a communication relay station (hereinbelow referred to as communication station) according to Embodiment 1 of the present invention will be described. FIG. 1 illustrates a structure of a cooling control method for a communication station according to Embodiment 1 of the present invention. In FIG. 1, numerical references same as those in FIG. 33 designate the same or similar portions and description of these portions are omitted. Numerical reference 11a designates a cooling control means for controlling a cooling capability of a compressor 5a depending on cooling conditions of communication equipments 2. Numerical reference 12 designates an electrical power detecting means, such as an electric power meter, for detecting an electric power consumption, consumed by operating communication equipments 2. Numerical reference 13 designates a suction temperature detecting means for the communication equipments, which means detects a temperature of a suction air 8 into the communication equipments. FIG. 2 is a block chart illustrating the cooling control means according to Embodiment 1 of the present invention. In FIG. 2, numerical reference 20 designates a means for setting a target value of the suction temperature into the communication equipments. Numerical reference 21a designates a means for controlling air conditions, which means controls a cooling capability of the air conditioner having an indoor unit 4, an outdoor unit 5, and so on. Numerical reference 22 designates a means for controlling a frequency, which means controls the frequency of a power source of a compressor motor. The cooling control means 11a is constructed by the target suction temperature value setting means 20 for the communication equipments, the air condition control means 21a, and the frequency control means 22.

In the next, an operation of the cooling control method for the communication station according to Embodiment 1 will be described in reference of FIGS. 1 and 2. By the cooling control method for the communication station, a suction air temperature in the communication equipments 2 is controlled to be within a predetermined temperature by supplying a requisite amount of the suction air for the communication equipments by a fan 4b toward the communication equipments 2. In general, a temperature of the suction air 8 for the communication equipments is controlled to be 35° C. or less. The suction air 8 is heated after cooling the communication equipments 2, is sucked into the indoor unit 4 so as to be cooled by an indoor heat exchanger 4a, is returned to a casing 10 as a blowing-out air 7, and cools the communication equipments 2 again as the suction air 8 for the communication equipments.

The cooling control means 11a controls the temperature of the suction air 8 for the communication equipments so as to be a temperature set by the target suction temperature value setting means 20 for the communication equipments, for example, 20° C. or less based on outputs from the target suction temperature value setting means for communication equipment 13 and electric power detecting means 12. Provided that a flow rate by the fan 3 is 40 m³/min, and an electric power detected by the electric power detecting means 12 is 12 kW, because most of the electric power consumption used by an electronic circuit board is occupied by the electric power consumption used by the communication equipments 2, and therefore the consumption electric power of the communication equipments 2 and a calorific value of the communication equipments 2 are substantially the same, a temperature difference between the suction air 6 for the indoor heat exchanger and the suction air 8 for the communication equipments is expressed by the following equation:

$$\Delta T=(\text{electric power consumption})/(\text{airflow rate} \times \text{air density} \times \text{specific heat of air at constant pressure}).$$

When the electric power consumption is 12 kW; the airflow rate is 0.67 m³/sec; the air density is 1.2 kg/m³; and the specific heat at constant pressure of the air is 1.01 kJ/kg.K, ΔT=15 deg. When the temperature of the suction air 8 for the communication equipments is 20° C., the temperature of the suction air 6 for the indoor heat exchanger is 20° C.+ΔT=20° C.+15 deg=35° C. Provided that the airflow rate of the fan 4b is 40 m³/min, in order to supply the suction air 6 for the indoor heat exchanger as the suction air 8 for the communication equipments after cooling to be 20° C., an electric power of 12 kW is necessary. By controlling a capability of the air conditioner upon a detection of the electric power consumption by the communication equipments, it is expected that the capability follows an actual heat load. However, the expected temperature is not attained because the blown-out air 7 is mixed with an atmosphere around the blown-out air 7 from the indoor unit in the casing, and the mixture becomes the suction air 8 for the communication equipments. Further, when the calorific value of the communication equipments 2 is abruptly changed, a very short time difference occurs until an influence of the change affects the output from the suction temperature detecting means 13 for the communication equipments. In order to correct the time difference, a requisite capability of the compressor is basically calculated by comparing a temperature, outputted from the suction temperature detecting means 13 for the communication equipments, with the set target value so that the suction air temperature 8 for the communication equipments becomes the set target value, obtained by the target suction temperature value setting means 20 for the communication equipments. Thereafter, an upper limit of maximum frequency of the compressor is calculated based on the detected electric power from the electric power detecting means 12, and the compressor 5a is controlled through the frequency control means 22 upon a command from the air condition control means 21a, which outputs the command about the frequency after correcting the above-mentioned requisite capability.

Figure 3:
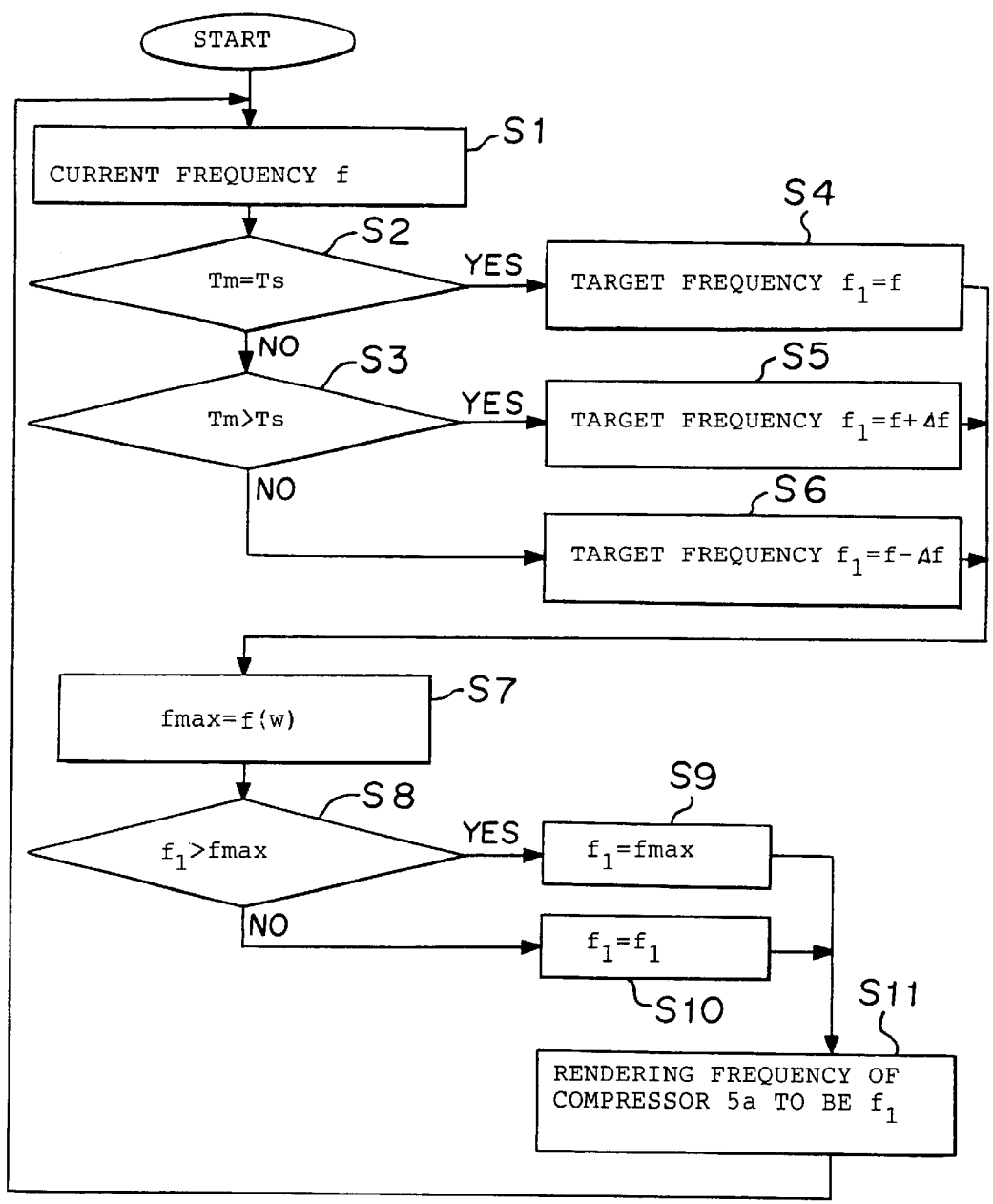
FIG. 3 is a flowchart showing a control by the cooling control means according to Embodiments 1 and 6 of the present invention.

FIG. 3 is a flowchart illustrating a control operation by the cooling control means 11a. The cooling control means 21a checks a current frequency f, currently outputting to the compressor 5a, in step S1, hereinbelow referred to as S1. In S2, a temperature Tm of the suction air 8 of the communication equipments, detected by the suction temperature detecting means 13 for the communication equipments, and a set temperature Ts of the suction air 8 for the communication equipments, set by the target suction temperature value setting means 20 for the communication equipments are checked. In S3, when the temperature Tm and the set temperature Ts are not equal, it is checked whether or not the temperature Tm exceeds the set temperature Ts. In S5, when the temperature Tm exceeds the set temperature Ts, the frequency of the power source for the compressor 5a is increased by a predetermined value through the frequency control means 22. In step S6, when the temperature Tm does not exceed the set temperature Ts, the frequency of the power source for the compressor 5a is decreased by a predetermined value through the frequency control means 22. In S4, when the temperature Tm is equal to the set temperature Ts in S2, the frequency is maintained without change. The air condition control means 21a receives an output from the electric power detecting means 12 and operates an upper limit fmax of the frequency of the compressor in S7. The upper limit fmax is obtained by a function f(w) having a variable of the output w from the electric power detecting means 12. The function is, for example, as follows:

$$f(w)=13.7(w=6)+30$$

This function is for a case that characteristics of the compressor 5a are 12 kW at 112 Hz and 6 kW at 30 Hz, and a capability of the compressor is changed so as to be linear in frequencies between 112 Hz and 30 Hz. In other words, a range of frequency is sufficient for making the compressor demonstrate cooling a capability for cooling the consumption electric power, i.e. calorific value, of the communication equipments 2 . In S8, fmax, operated based on the function f(w), and f1, calculated as above, are compared. In S9, S10, and S11, when f1 is larger then fmax, the frequency of the compressor is set to be fmax; and when f1 is fmax or less, the frequency of the compressor is set to be f1. As described, the frequency of the compressor is controlled.

Needless to say that, in S2 and S3 in FIG. 3, it may be determined whether the temperature Tm of the suction air 8 for the communication equipments is equal to or larger than a value obtained by adding or subtracting a predetermined value from the set temperature Ts of the suction air 8 for the communication equipments. In other words, by giving a predetermined range to the set temperature Ts and determining whether or not the temperature Tm is in this range, higher than an upper limit of the range, lower than a lower limit of the range, or in other positions, the temperature Tm may be brought into the range of the set temperature Ts.

In Embodiment 1, it is possible to provide the cooling control method, which makes the temperature of the suction air for the communication equipments stable, and by which a load and a change of the calorific value in accordance with the number of operations of the communication equipments 2 are dealt with. This control is realized by detecting the temperature of the suction air 8 for operating the communication equipments 2 by the suction temperature detecting means 13 for the communication equipments and controlling the air conditioner by the cooling control means to bring the temperature of the suction air 8 within the range of the set temperature Ts. Further, there is a case that the calorific value of the communication equipments 2 is abruptly changed. In this case, the control depending on only the output signal from the suction temperature detecting means 13, obtained as a result of the change, is insufficient. Therefore, it is possible to achieve a stable control with a good follow-up capability by previously obtaining the output signal from the electric power consumption detecting means 12, being a factor for changing the temperature Tm of the suction air 8, and controlling the frequency of the compressor.

Although, in FIG. 3, the upper limit fmax of the frequency of the compressor is set in S7, the following steps may be adopted. At first it is judged whether the electric power consumption is increased or decreased by comparing detected values of the electric power before and after a receipt from the electric power detecting means 12 in S4, S5, S6, and S7. When the electric power consumption is decreased, a process similar to that described in FIG. 3 is proceeded. When the electric power consumption is increased. In S7, the upper limit fmax is changed to the lower limit fmin=f(w) of the frequency of the compressor, and the lower limit fmin of the frequency of the compressor is changed to f(w) shown in FIG. 3. In S8, it is judged whether or not f1<fmin. In S9, when f1<fmin, f1=fmin is established. In S10, when f1≧fmin, f1=f1 is established. Thereafter, S11 is selected.

In such a case, when the calorific value of the communication equipments 2 is abruptly increased or decreased, it is possible to rapidly deal with the increment and the decrement, and a stable control with a good follow-up capability is obtainable.

Meanwhile, the control method, illustrated in FIG. 3, may be modified and simplified using only S4, S5, and S6 through S11 and removing S7, S8, S9, and S10.

Figure 4:
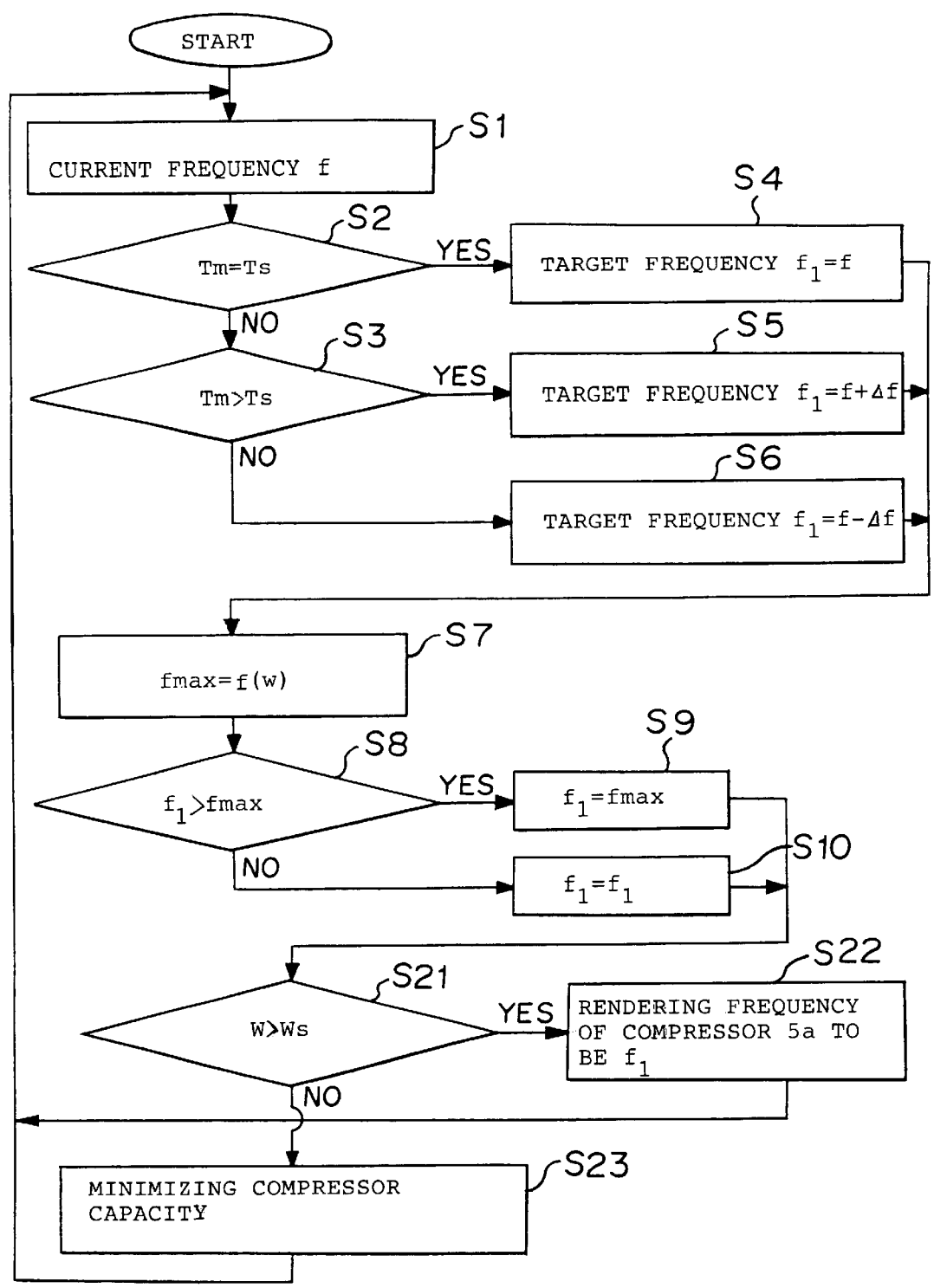
FIG. 4 is a flowchart illustrating a control by another cooling control means according to Embodiments 1 and 6 of the present invention.

FIG. 4 is a flowchart illustrating another example of the cooling control method according to Embodiment 1 of the present invention. A procedure until S9 and S10 is the same as above.

A structure of the cooling method is illustrated in FIG. 1, and a block chart of the cooling method is illustrated in FIG. 2. In FIG. 4, after calculating the frequency f1 in step S9 or S10, an electric power consumption W, i.e. an output from the electric power detecting means 12, at a time of calculating the frequency f1 is compared with the set value Ws of a previously set consumption electric power in S21. In S22, when W>Ws, the frequency of the compressor 5a is set to be f1. In S23, when W≦Ws, the capability of the compressor is minimized. This means that the frequency in the compressor is rendered to be smallest frequency, in which the compressor can be driven. Or it may be possible to form a refrigerating circuit for bypassing a part of a refrigerant, flowing into the outdoor heat exchanger 5b on a suction side of the compressor, to further degrade the cooling capability by making the frequency a minimum frequency enabling the operation of the compressor. The bypass circuit is not illustrated in FIG. 1.

The set value Ws is made a little larger than a minimum capability of the air conditioner. For example, when the minimum capability is 6 kW, the set value Ws is 7 kW. In the first example of Embodiment 1, when the calorific value of the communication equipments is reduced, there is a case that the compressor is stopped by a thermo-off because the capability of the air conditioner is sequentially reduced in accordance with the reduced calorific value, and finally the calorific value becomes smaller than the minimum capability of the air conditioner. In this example, step S21 is added to judge to minimize the capability of the compressor before the decrement of the calorific value less than the minimum capability of the air conditioner, whereby the thermo-off does not easily occur. Repetition of the thermo-ons and the thermo-offs does not only shorten a lifetime of a compressor but also causes moisture condensation in the casing.

Further, a process of designating the upper limit value of the frequency in FIG. 4 may be changed. As in a flowchart illustrated in FIG. 5, the output W from the electric power detecting means 12 is compared with the set value Ws in S51, and the capability of the compressor is minimized in S53 when W≦Ws is established. It is possible to simplify the structure of the cooling control method while maintaining a function of preventing the moisture condensation, caused by the repetition of thermo-ons and thermo-offs. A structure and a block chart of this modification are respectively illustrated in FIG. 1 and FIG. 2.

Embodiment 2

Figure 6:
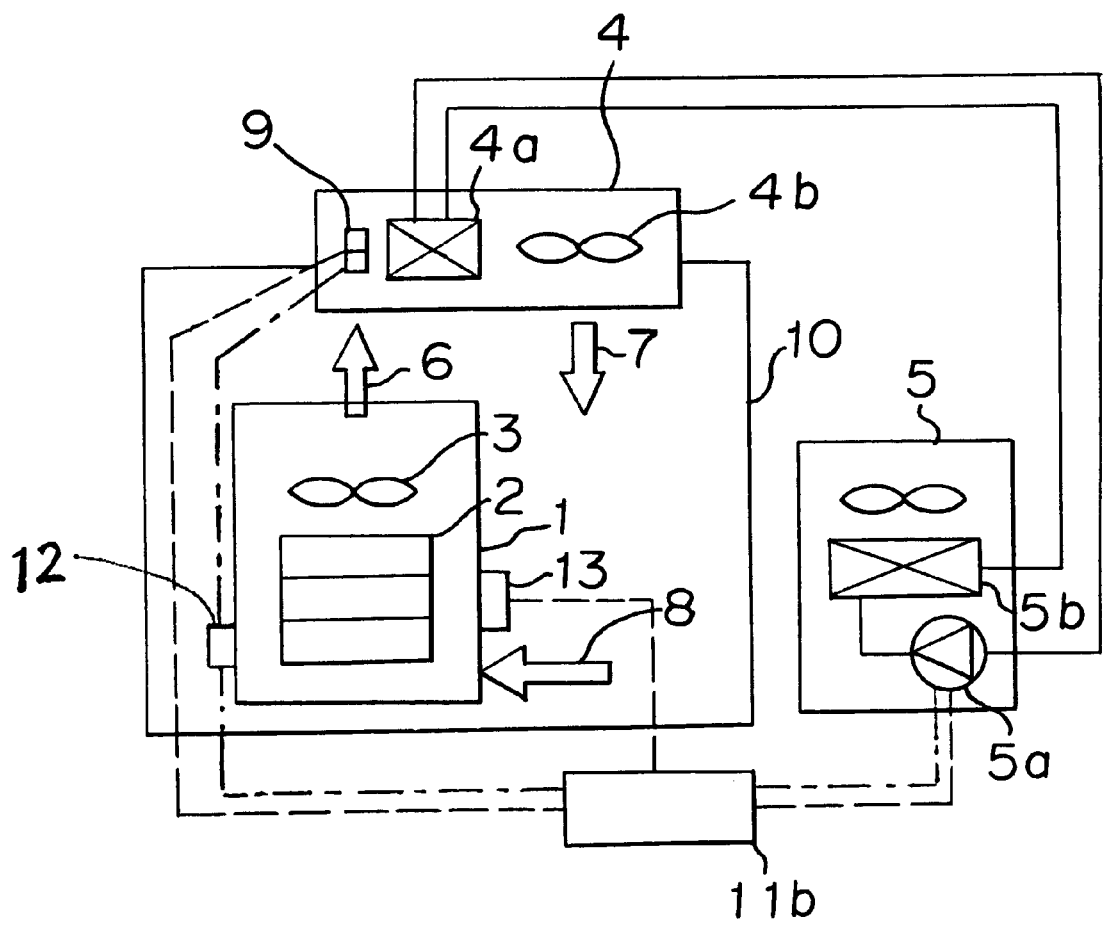
FIG. 6 illustrates a structure of a cooling control method for communication stations according to Embodiments 2 and 7 of the present invention.
Figure 7:
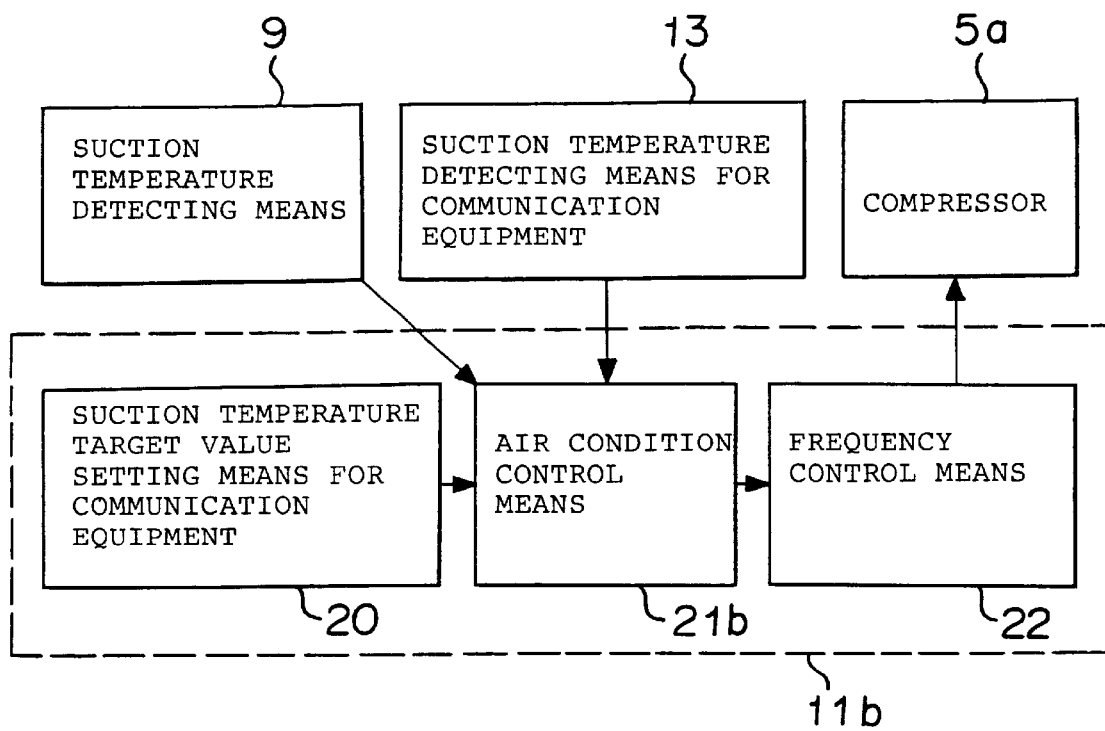
FIG. 7 is a block chart illustrating a cooling control means according to Embodiment 2 of the present invention.

Hereinbelow, an example of a cooling control method for a communication station according to Embodiment 2 of the present invention will be described. FIG. 6 illustrates a structure of the cooling control method for the communication station according to Embodiment 2 of the present invention. FIG. 7 is a block chart of the cooling control method. In FIGS. 6 and 7, the same numerical references as those in FIGS. 25, 1 and 2 designate the same or similar portions and description of these portions is omitted. Numerical reference 11b is a cooling control means for controlling a cooling capability of an air conditioner. Numerical reference 9 designates a suction temperature detecting means for an indoor unit of the air conditioner, which detects a suction air temperature into the indoor unit.

Figure 8:
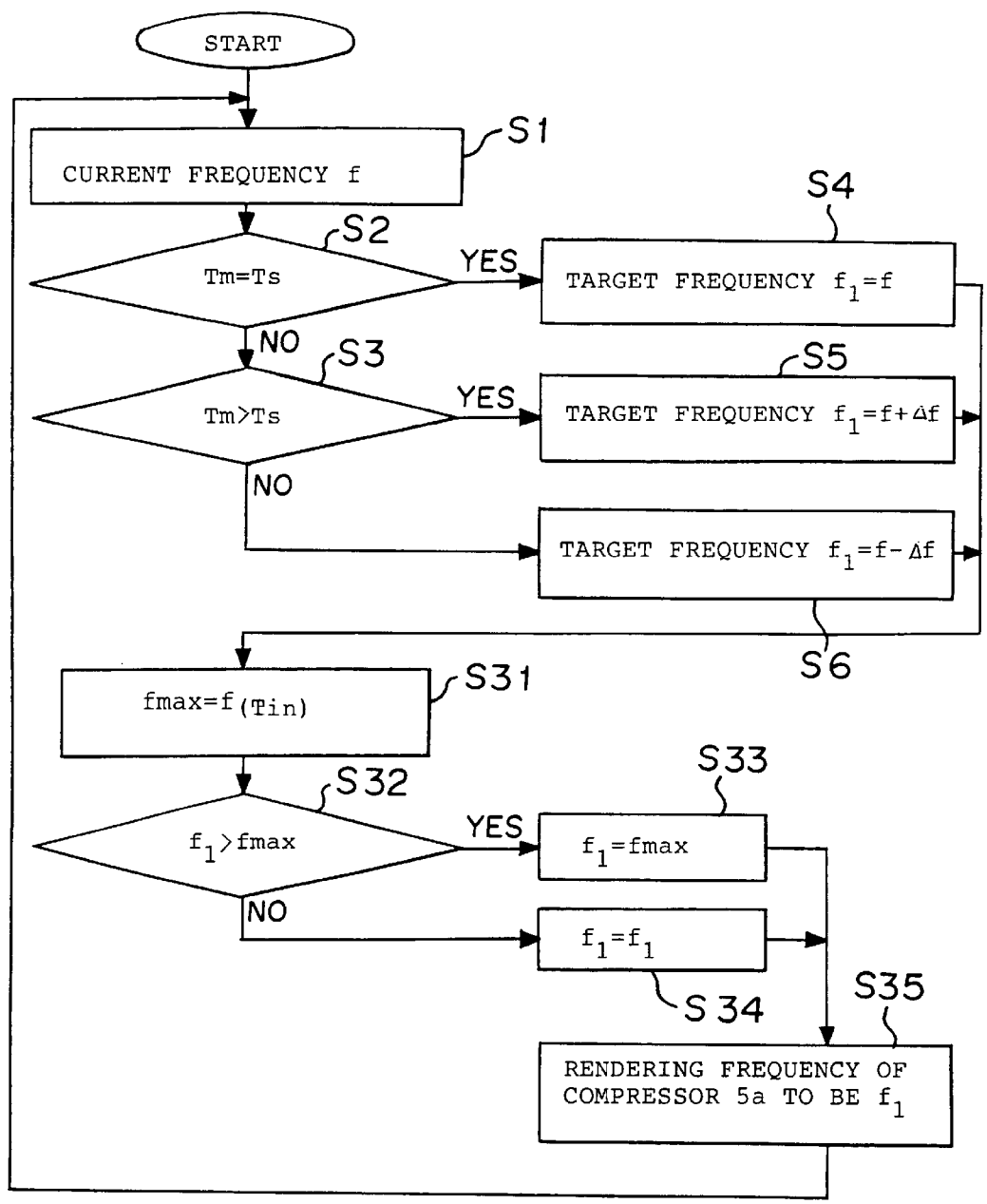
FIG. 8 is a flowchart illustrating a control by the cooling control means according to Embodiment 2 of the present invention.

FIG. 8 illustrates a flowchart illustrating an operation of the cooling control method. A processes until S5 and S6 is similar to that described in Embodiment 1. In S31, the upper limit fmax of the frequency is obtained as a function f(Tin) having a variable of a suction temperature Tin detected by the suction temperature detecting means 9. When a temperature Tm of the suction air 8 for the communication equipments is constant, there is a relationship between the calorific value of the communication equipments and the suction temperature Tin of the indoor unit:

$$Tin \propto \text{(calorific value of communication equipment)}$$

Accordingly, it is possible to substitute the suction temperature for the electric power consumption, described in Embodiment 1 in reference of FIG. 3. For example, provided that Tm=20° C. (constant), and the airflow rate of the blower 3 is 40 m³/min, the following equation is established:

$$Tin = Tm + \Delta T = 20 + 1.23W,$$

where the consumption electric power is denoted by W, the airflow rate is 0.67 m²/sec, the air density is 1.2 kg/m³, and the specific heat at constant pressure of the air is 1.01 kJ/kg.K, wherein the equation/$\Delta T$=(electric power consumption)/(airflow rate×air density×specific heat of air at constant pressure), described in Embodiment 1, is used.

Further by substituting thus obtained W for W in the equation f(W)=13.7(W-6)+30, described in Embodiment 1, the following equation is obtained:

$$f(Tin) = 11.2Tin - 277$$

For example, fmax is calculated by such a function.

In case that the suction temperature Tin is 35° C., the following equation is established:

$$f(Tin) = 115 \text{ Hz},$$

where $$Tin=35° C.$$

This represents a case that a capability of the compressor 5a is linearly changed on a premise that characteristics of the compressor 5a is 12 kW at 112 Hz and 6 kW at 30 Hz. Thus operated fmax from f(Tin) and f1 calculated above are compared in S32. In S33, S34 and S35, the frequency of the compressor is set to be fmax, in case that f1 is larger than fmax; and the frequency is set to be f1 in case that f1 is fmax or less.

Thus the frequency of the compressor is controlled.

Further, although it is not illustrated in the flowchart, when thus calculated f1 is out of a frequency band enabling to use the compressor, it is possible to add a function of limiting the frequency at upper and lower limit values.

There is a case that the calorific value of the communication equipments 2 abruptly changes. In such a case, it is insufficient to control using only the output signal from the suction temperature detecting means 13 for the communication equipments. By checking and controlling the suction temperature Tin reflecting a change of the calorific value of the communication equipments, being a factor for changing the temperature Tm, it is possible to stably control with a good following-up capability.

In the next, a cooling control method for communication relay stations according to an another example in Embodiment 2 will be described in reference of Figures. In FIGS. 6 and 7, a structure and a block chart are respectively illustrated.

Figure 9:
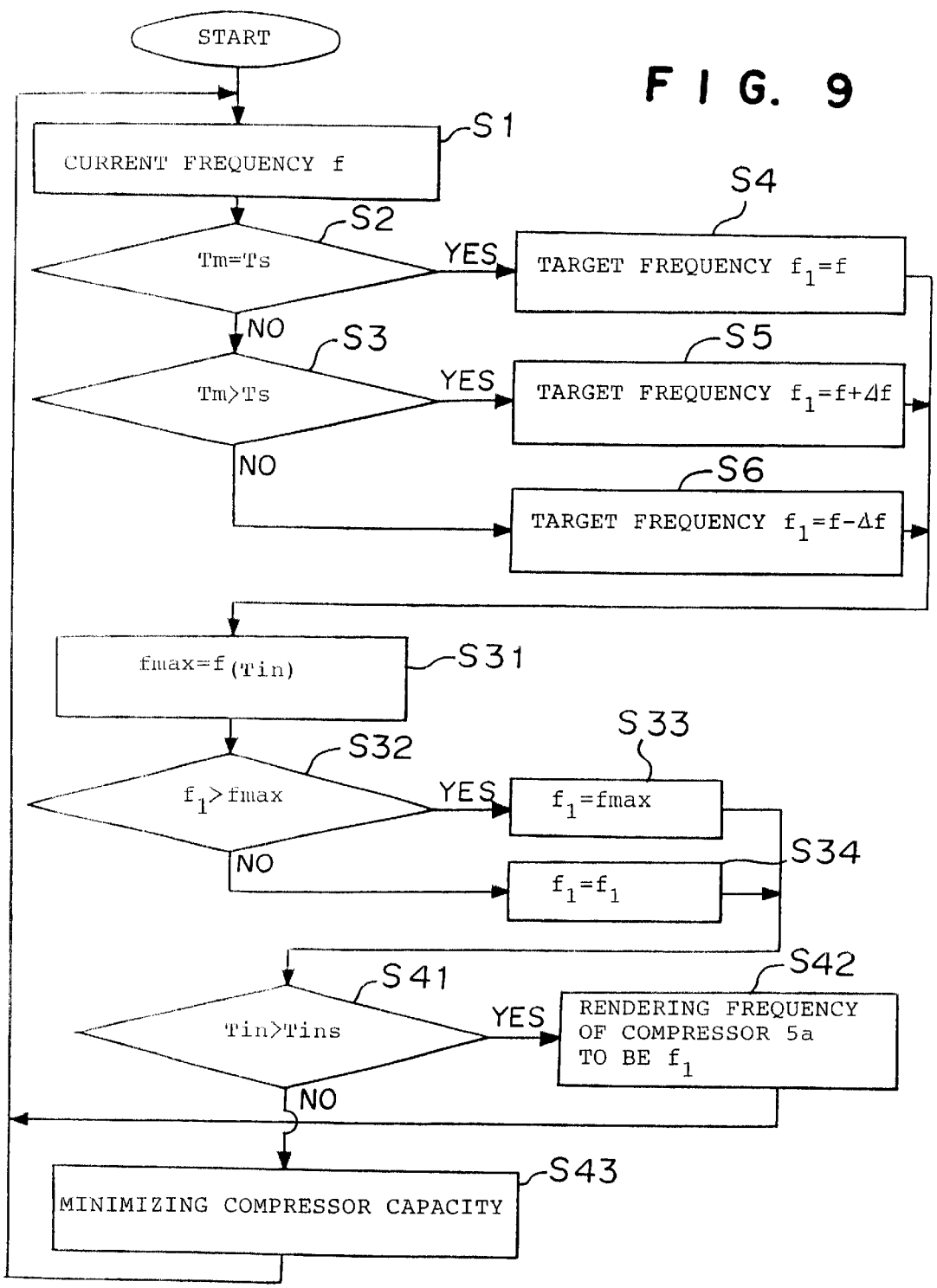
FIG. 9 is a flowchart illustrating a control by another cooling control means according to Embodiment 2 of the present invention.
Figure 10:
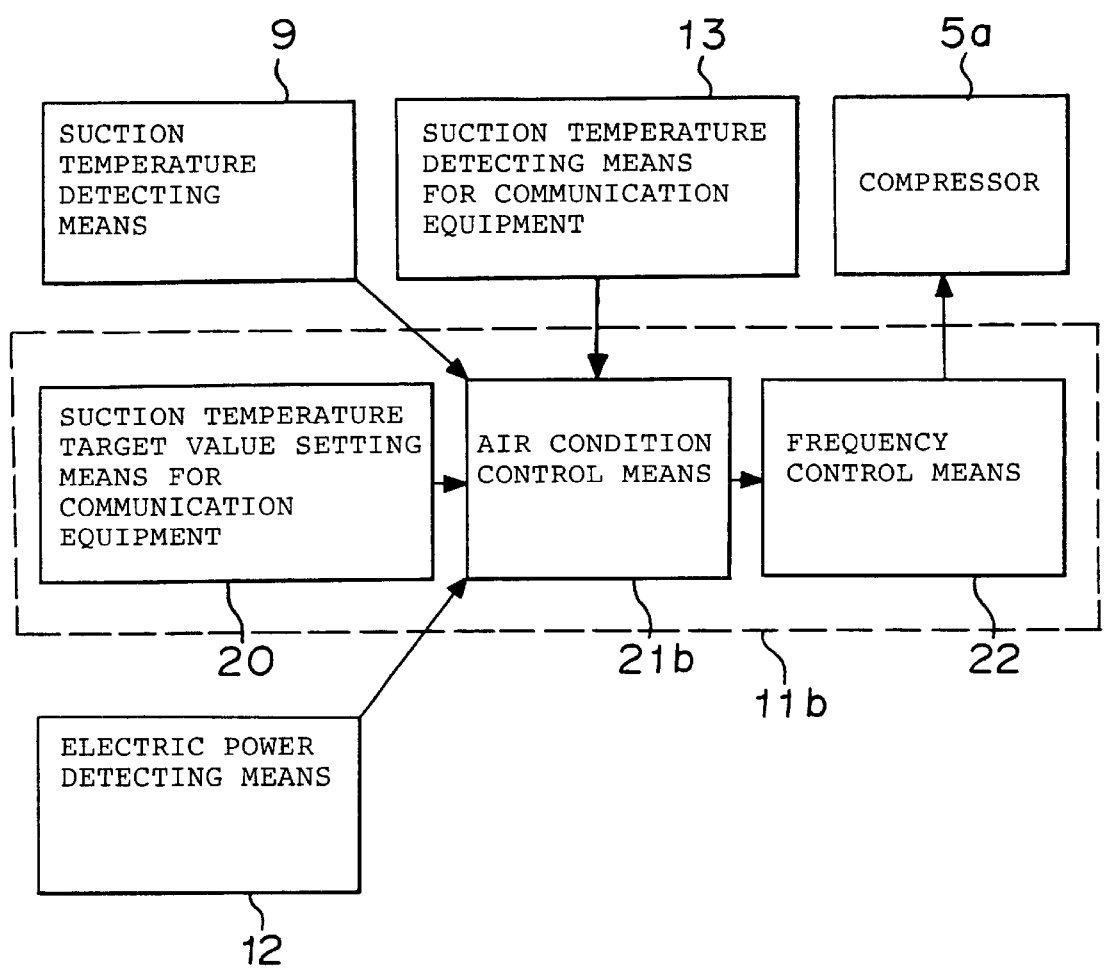
FIG. 10 is a block chart illustrating another cooling control means according to Embodiment 2 of the present invention.
Figure 11:
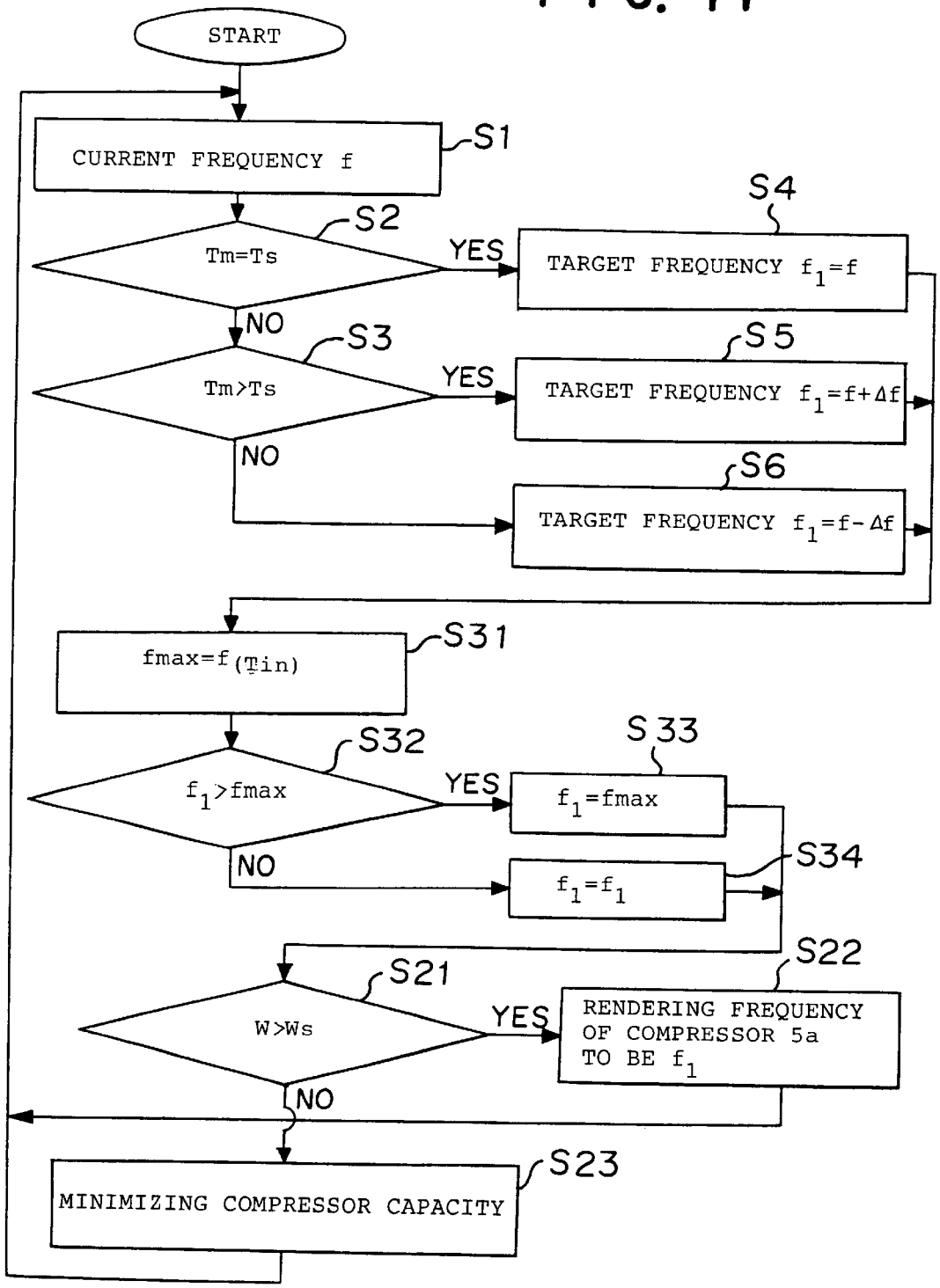
FIG. 11 is a flowchart illustrating a control by another cooling control means according to Embodiment 2 of the present invention.
Figure 12:
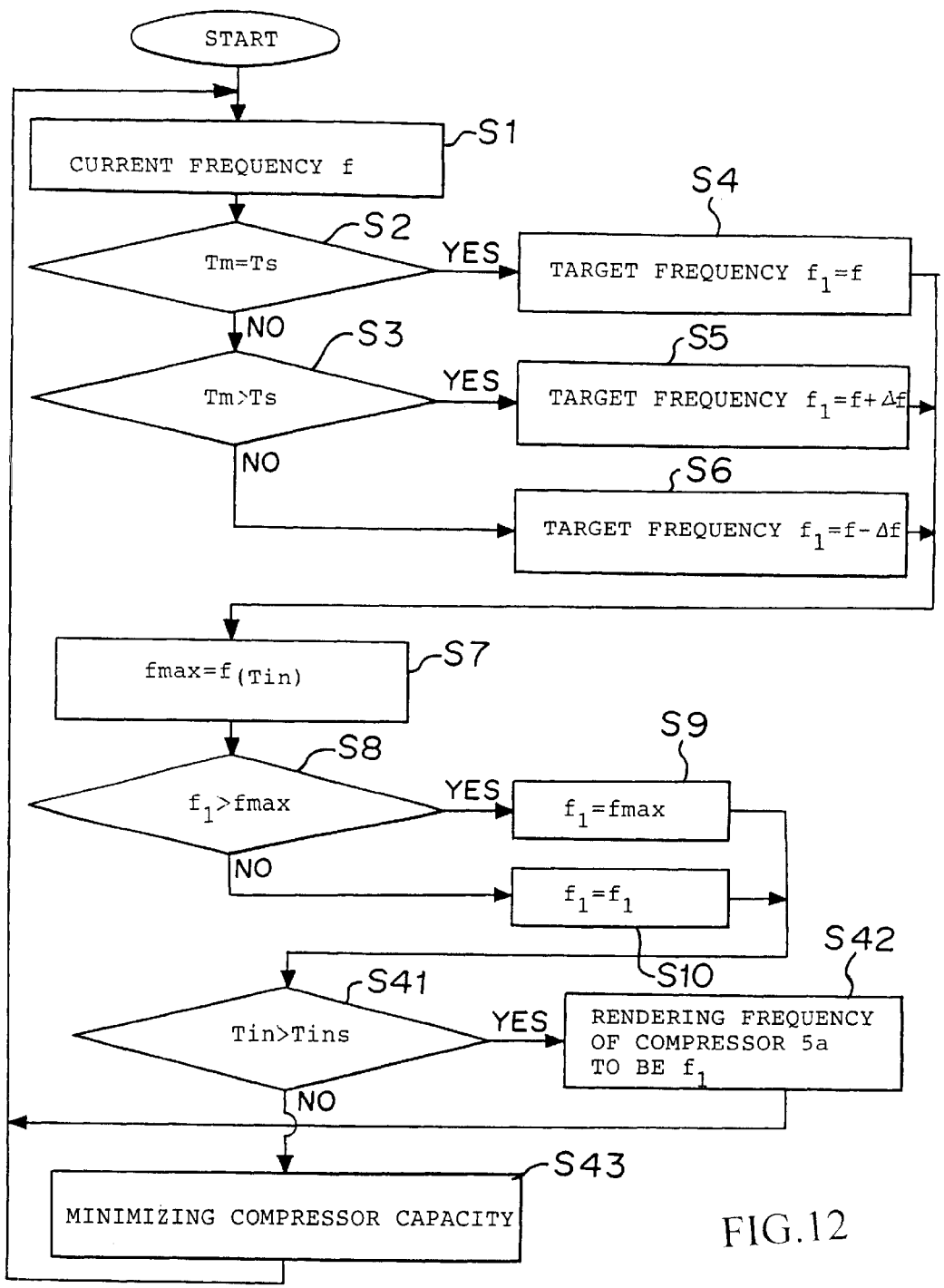
FIG. 12 is a flowchart illustrating a control by another cooling control means according to Embodiment 2 of the present invention.

FIG. 9 is a flowchart illustrating an operation of the cooling control means 11b. In FIG. 7, a procedure according to this example of Embodiment 2 is the same until the steps S33 and S34, described in the former example. After calculating the frequency f1 in the step S33 or S34, a suction temperature Tin of the indoor unit, outputted from the suction temperature detecting means 9, is compared with a previously set value Tins of the suction temperature in S41. When Tin>Tins, the frequency of the compressor is set to be f1 in S42. When Tin≦Tins, the capacity of the compressor is minimized in S43. This means that the frequency of the compressor is decreased to a minimum frequency enabling the operation of the compressor. Further, a refrigerating circuit is constructed so as to bypass a part of a refrigerant flowing into the outdoor heat exchanger 5b on a suction side of the compressor (not shown in FIG. 6). In this case, a cooling capability can be degraded by making the frequency of the compressor to be the minimum frequency enabling the operation of the compressor. Such an application can also be adopted.

The set value Tins is determined as follows. Step S41 in FIG. 9 has a significance similar to the step S21 in Embodiment 1 with reference to FIG. 4. When the temperature Tm of the suction air 8 into the communication equipments is constant, there is the following relationship between the calorific value of the communication equipments and the suction temperature Tin of the indoor unit:

$$Tin \propto \text{(calorific value of communication equipment)}$$

Accordingly, it is possible to substitute the suction temperature for the electric power consumption described in reference of FIG. 4. Because the set temperature Tins is little higher than the minimum capability of the air conditioner, when the minimum capability is 6 kW as in FIG. 4, for example, Tin with respect to the electric power consumption of 7 kW is determined. At this time, a temperature difference ΔT between the suction air 6 and the suction air 8 for the communication equipments with respect to the electric power consumption of 7 kW becomes ΔT=8.7 deg, in use of the above-mentioned constants and the equations. When Tm is 20° C., $$Tin=Tm+\Delta T=28.7° C.,$$

wherein $$Tins=28.7° C.$$

Figure 5:
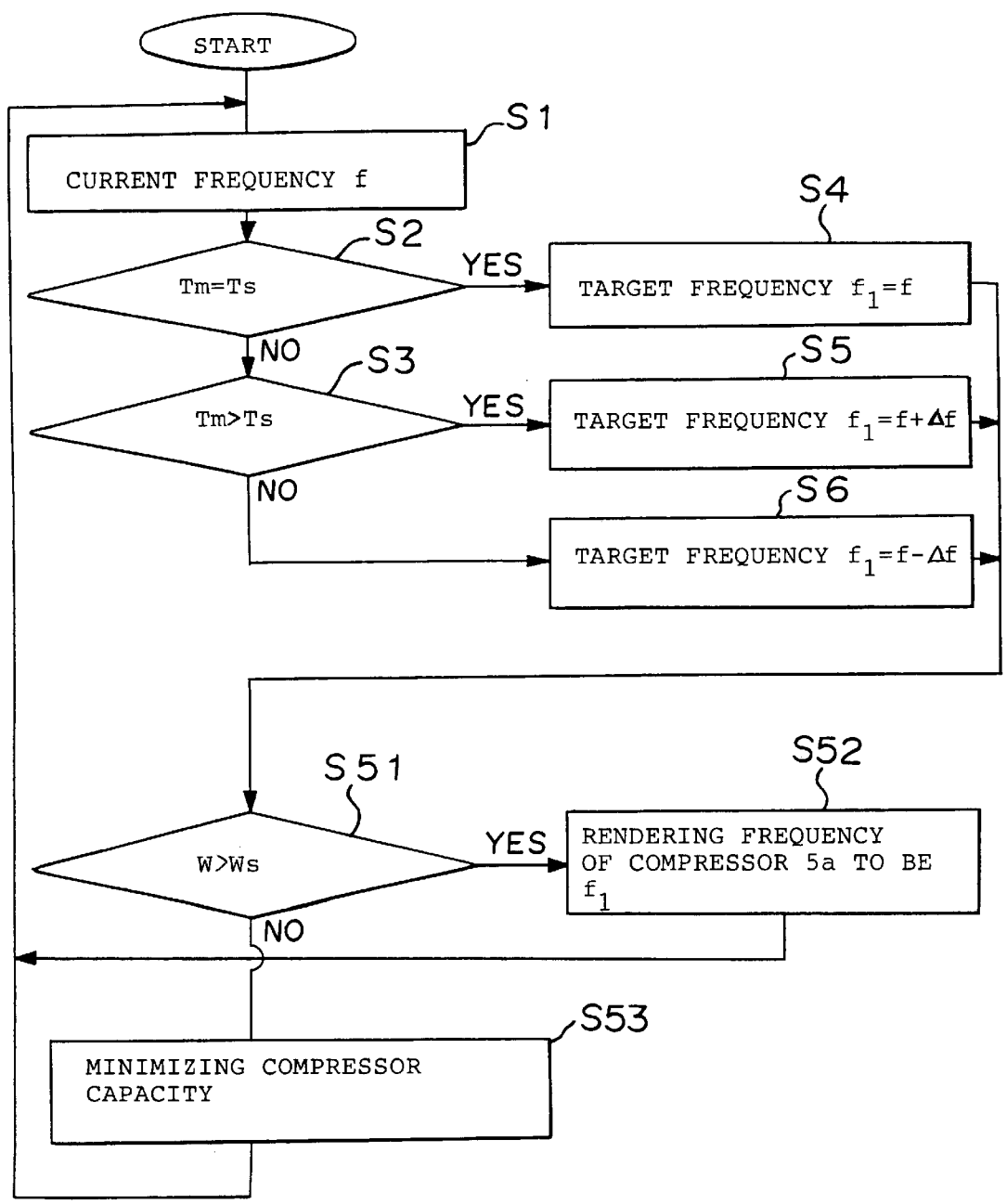
FIG. 5 is a flowchart illustrating a control by another cooling control means according to Embodiment 1 of the present invention.

In FIG. 9, as described in Embodiment 1 with reference to FIG. 5, a structure of the method can be simplified by directly connecting S4, S5 and S6 to S32 and removing S31, S32, S33, and S34 in FIG. 9, whereby a function of preventing moisture condensation caused by repetitions of thermo-ons and thermo-offs.

Further, it is possible to substitute S21, S22, and S23, described in Embodiment 1 with reference to FIG. 4, for S41, S42, and S43 in FIG. 9. In other words, it is controlled as illustrated in a flowchart of FIG. 11, whereby when the calorific value of the communication equipments is reduced, the compressor is seldom stopped, i.e. thermo-off by sequentially reducing the capability of the air compressor and thereby the calorific value becomes smaller than the minimum capability. Thus a lifetime of the compressor caused by the repetition of thermo-ons and thermo-offs is prevented from reducing, and the moisture condensation can be prevented. In this case, the electric power detecting means 12 is added to FIG. 6, and a block chart illustrating this case is in FIG. 10. Further, it is possible to substitute S41, S42, and S43, illustrated in FIG. 9, for S21, S22, S23, described in Embodiment 1 with reference to FIG. 4. In other words, by controlling like a flowchart illustrated in FIG. 12, similar function and effect are obtainable. In this case, the electric power detecting means 12 is added to FIG. 6, and a block chart illustrating this case is in FIG. 10 as above.

Further, although in Embodiments 1 and 2, the cases of detecting electric power consumption of electronic boards of the communication equipments is detected by the electric power detecting means 12, the electric power consumption may be substituted by a current of the communication equipments. There is an effect of detecting the electric power consumption by calculating the electric power consumption from a detected total value of the current of the communication equipments, accommodated in the casing, using an ampere meter, of which cost is lower than that of the electric power meter, so as to form the electric power detecting means.

Embodiment 3

Figure 13:
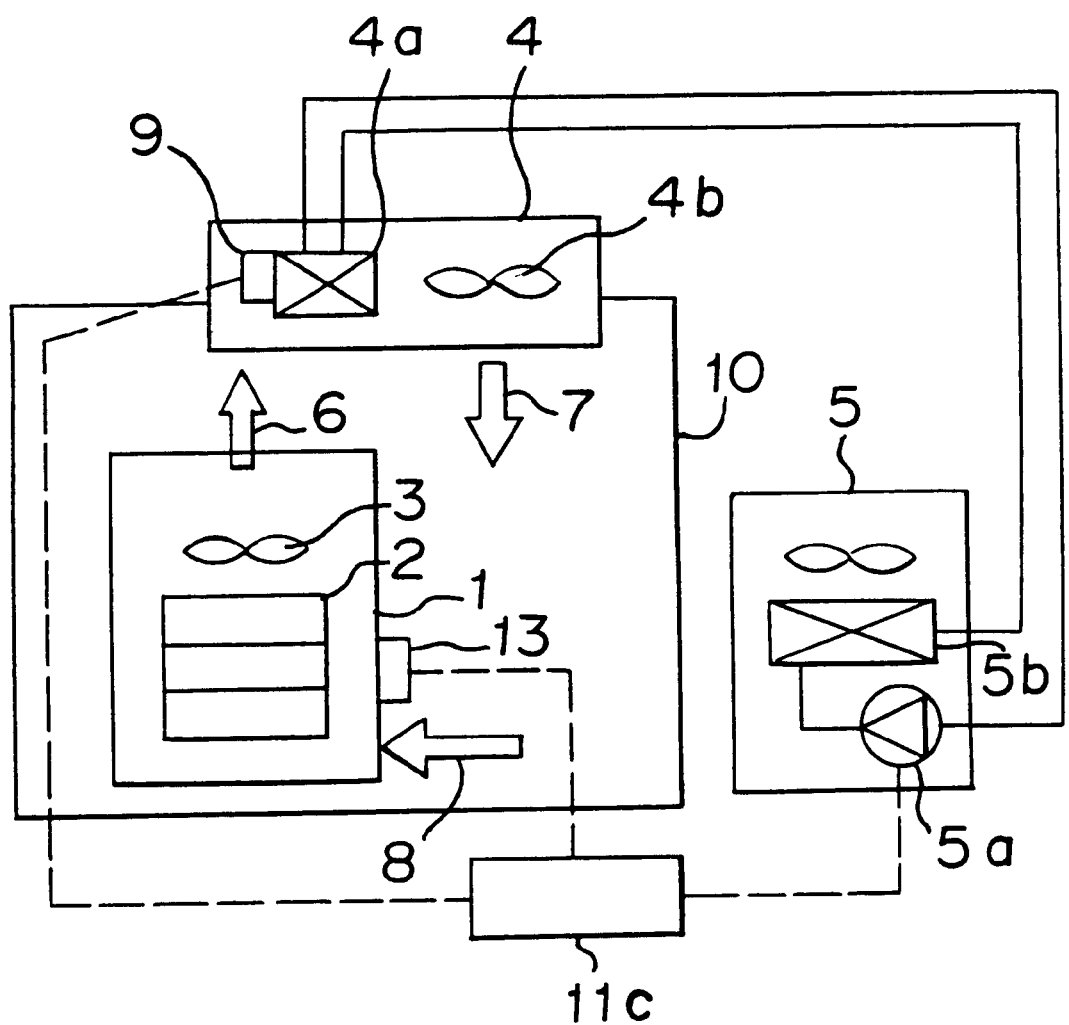
FIG. 13 illustrates a structure of a cooling control method for a communication station according to Embodiment 3 of the present invention.
Figure 14:
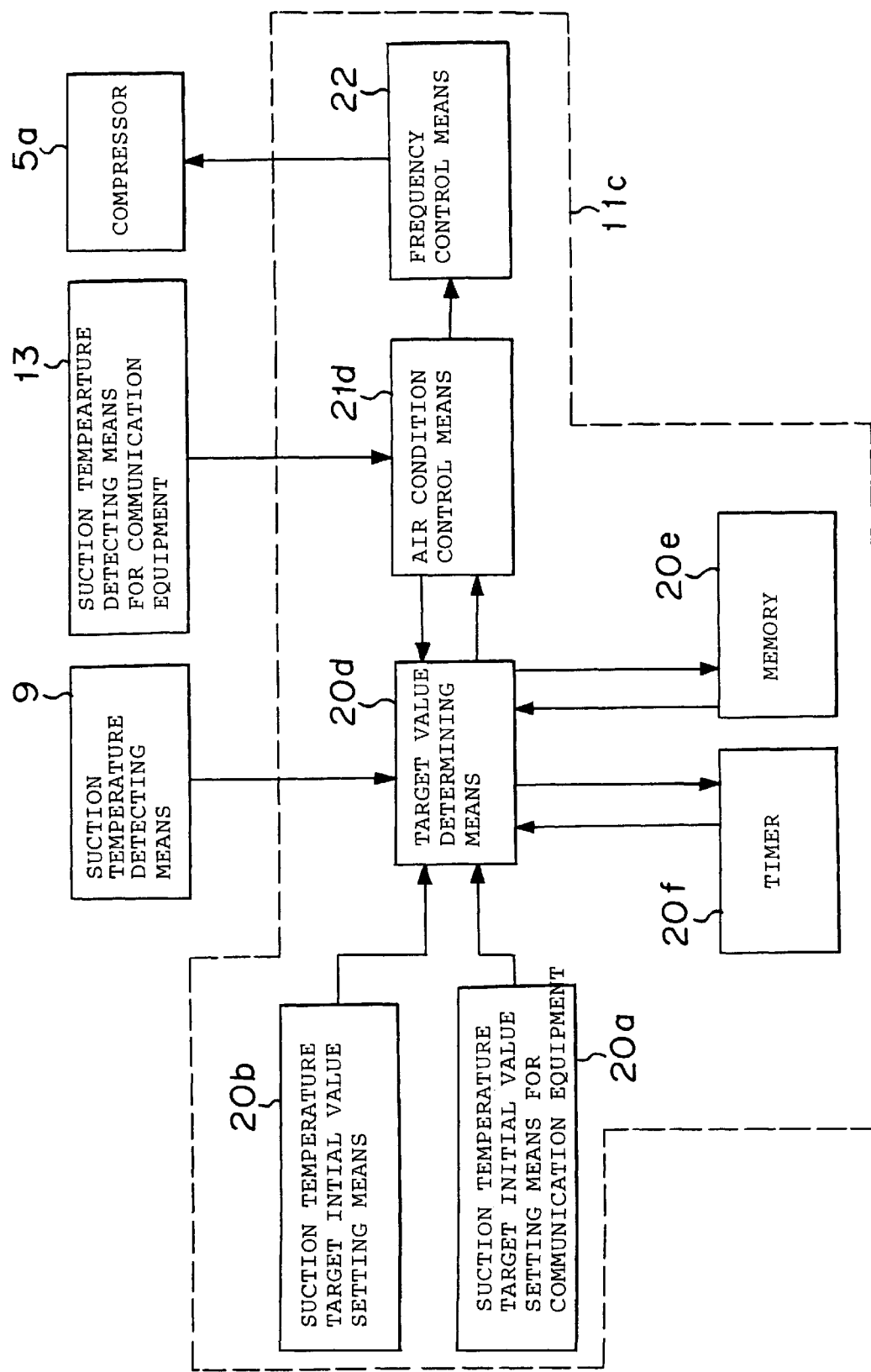
FIG. 14 is a block chart illustrating a cooling control means according to Embodiment 3 of the present invention.
Figure 15:
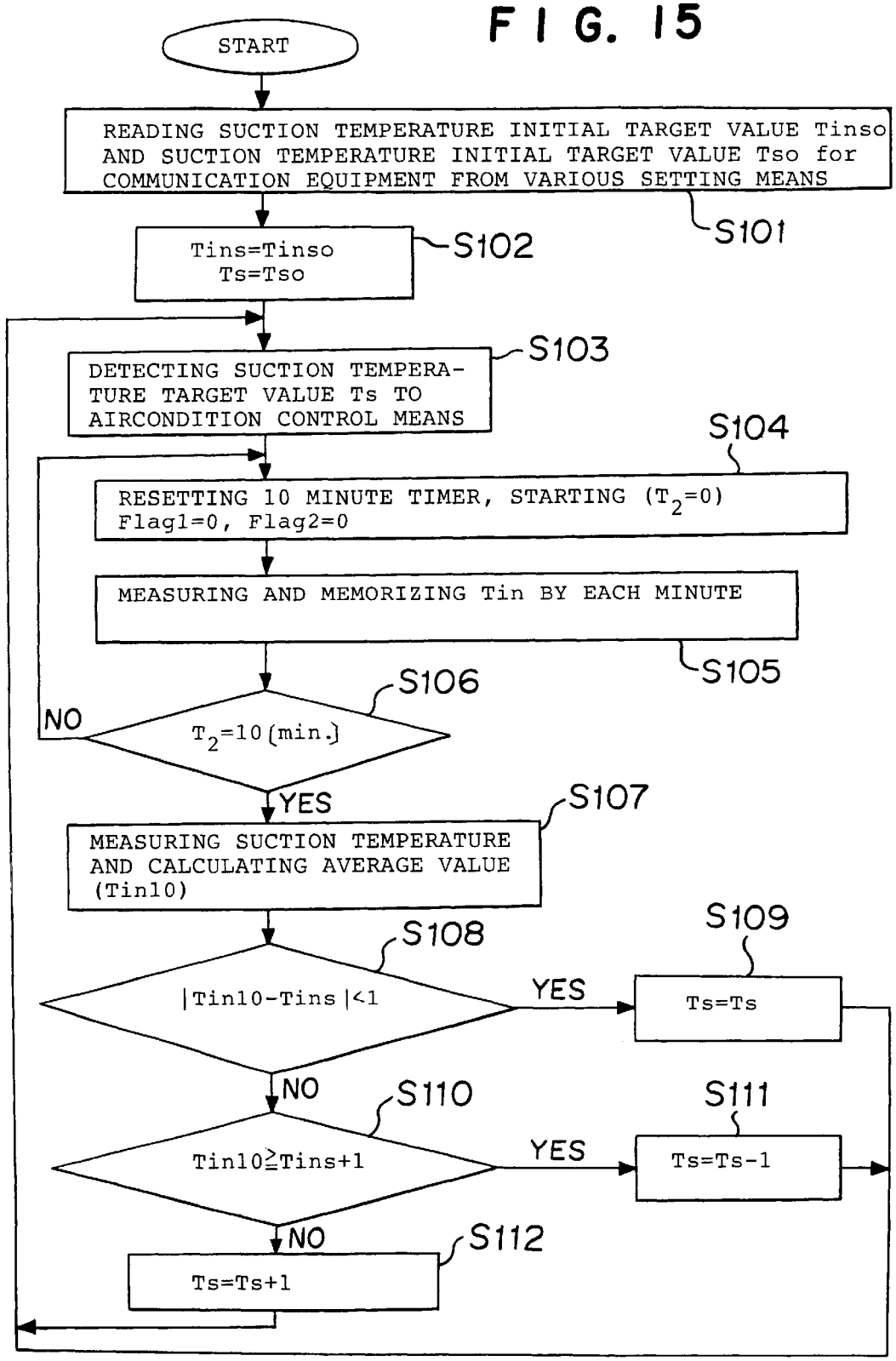
FIG. 15 is a flowchart illustrating a control by the cooling control means according to Embodiment 3 of the present invention.

Hereinbelow, an example of a cooling control method for communication stations according to Embodiment 3 of the present invention will be described. FIG. 13 illustrates a structure of the cooling control method for the communication station according to Embodiment 3 of the present invention. FIG. 14 is a block chart of the cooling control method. FIG. 15 is a flowchart illustrating a control by the cooling control method. In FIGS. 13 and 14, numerical references same as those described in Embodiments 1 and 2 designate the same or similar portions and description of these portions is omitted. Numerical reference 11c designates a cooling control means for controlling a cooling capability. Numerical reference 20a designates an initial target suction temperature value setting means for the communication equipments. Numerical reference 20b designates an initial target suction temperature value setting means for the indoor heat exchanger. Numerical reference 20d designates a target value determining means for determining a target value of the suction temperature for the indoor heat exchanger and a target value of the suction temperature for the communication equipments. Numerical reference 21d designates an air condition control means for controlling a capability of the air conditioner based on the target value f the suction temperature for the communication equipments determined by the target value determining means 20d. Numerical reference 20e designates a memory for memorizing outputs detected by the suction temperature detecting means 9 and the suction temperature detecting means 13. Numerical reference 20f designates a timer.

The cooling control means 11c is formed by the initial target suction temperature setting means 20a, the initial target suction temperature value setting means 20b, the target value determining means 20d, the memory 20e, the timer 20f, the air condition control means 21d, the frequency control means 22, and so on.

Figure 16:
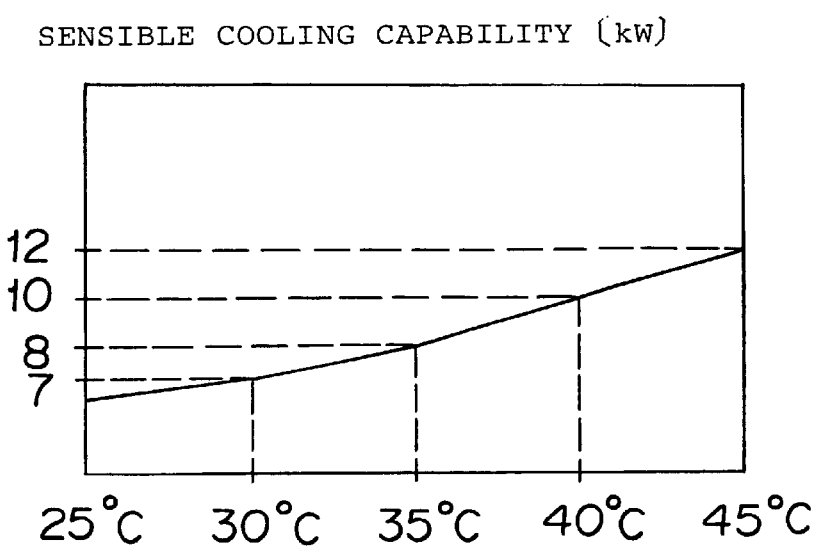
FIG. 16 illustrates a relationship between a suction temperature and a cooling capability of an air conditioner.

In general, when an air conditioner is operated by increasing the suction temperature less than a limit value, ordinarily 40° C. or less, an efficiency is improved as in FIG. 16, wherein a sensible cooling capability in the ordinate is increased along with an increment of the suction temperature into the air conditioner in the abscissa. In FIG. 13, when the suction temperature detected by the suction temperature detecting means 9 is maintained as high as possible, the efficiency is improved. In order to attain this state, the following control is performed.

A controlling operation by the cooling control means 11c will be described in reference of a flowchart illustrated in FIG. 15. The target initial value Tinso, set by the suction temperature initial target value setting means 20b, and the initial target value Tso, set by the suction temperature initial target value setting means 20a for the communication equipments, are read out in S101. In S102, the read out values are used respectively as the suction temperature target value Tins and the suction temperature target value Ts for the communication equipments. In S103, the suction temperature target value Ts, being equal to Tso, of the communication equipments is inputted into the air condition control means 21d. The air condition control means 21d compares the output Tm from the suction temperature detecting means 13 for the communication equipments with the suction temperature target value Ts for the communication equipments, controls the frequency control means 22, and controls a capacity of the compressor 5a, whereby the capability of the air conditioner is controlled. The capability of the air conditioner is controlled in accordance with, for example, S1 through S6 illustrated in FIGS. 3, 4, 5, 8, 9, 11 and 12 and described in Embodiments 1 and 2. The suction temperature Tin of the indoor unit and the suction temperature Tm of the communication equipments, obtained as a result of the control, are respectively detected by the detecting means 9 and 13, and the detected values are memorized every minute in S105. In S104 and S106, ten minutes are counted. In S107, the suction temperature detected values Tin for the ten minutes are read out from the memory 20e, and an average value Tin10 of the suction temperature detected values is calculated by the target value determining means 20d. The average value and the suction temperature target value Tins are compared in S108. When a difference between the average value and the suction temperature target value Tins is smaller than a range of ±1° C., the suction temperature target value Ts for the communication equipments is unchanged in S109. In S110, it is judged whether or not the average value Tin10 is higher than the suction temperature target value Tins by 1° C. or more. When higher by 1° C. or more, the suction temperature target value Ts for the communication equipments is decreased by 1° C. in S111. On the other hand, when the average value is lower than the suction temperature target value Tins plus 1° C. in S110, the suction temperature target value Ts for the communication equipments is increased by 1° C. in S112. In S103, thus determined suction temperature target value Ts for the communication equipments are inputted into the air condition control means 21d again. These operations are repeated.

Figure 17:
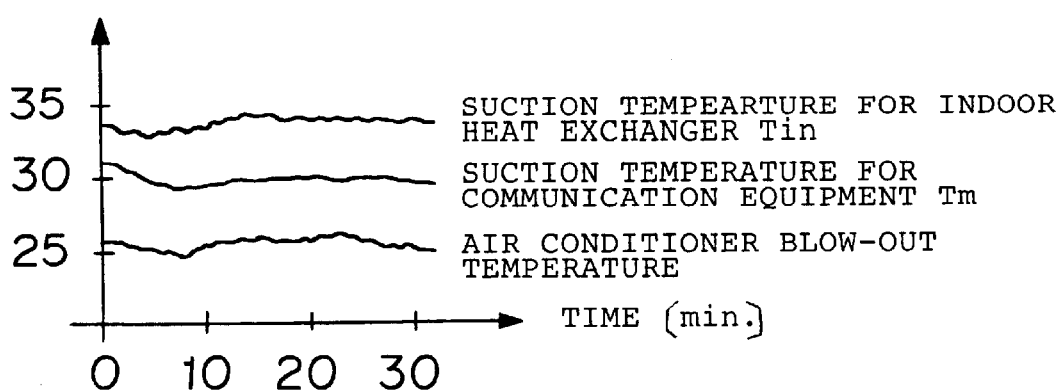
FIG. 17 illustrates a relationship of various temperatures of the air conditioner according to Embodiment 3 of the present invention.

By setting the suction temperature target value Tins as high as possible so as not to exceed the limit value, it is possible to use the air conditioner at a high temperature range as close as possible to the suction temperature target value Tins, whereby the air conditioner is in a highly efficient state. Further, moisture condensation can be prevented because the blowing-out temperature from the air conditioner is increased. As an example of this embodiment, FIG. 17 illustrates a case that the initial value of the suction temperature target value Ts for the communication equipments is 30° C. and the initial value of the suction temperature target value Tins is 35° C. In FIG. 17, the capability of the air conditioner is balanced with the loads, and the suction temperature tin, the suction temperature Tm for the communication equipments, and the blowing-out temperature for the air conditioner becomes even with a lapse of time. The reason why the average value of the detected values of the suction temperature for every ten minutes is used for controlling the air compressor is to avoid disturbance in the control, caused by a temporary change of the temperature in the communication station. In general, there is a case of controlling the frequency by every one minute for controlling a capability of an air conditioner by an air condition control means. In this case, frequent changes in a suction temperature target value Ts for the communication equipments make the control unstable. As described in this embodiment, by automatically setting and changing the suction temperature target value Ts for the communication equipments, it is possible to use the air conditioner in a most preferable manner in conformity with an actual conditions of the loads.

Figure 18:
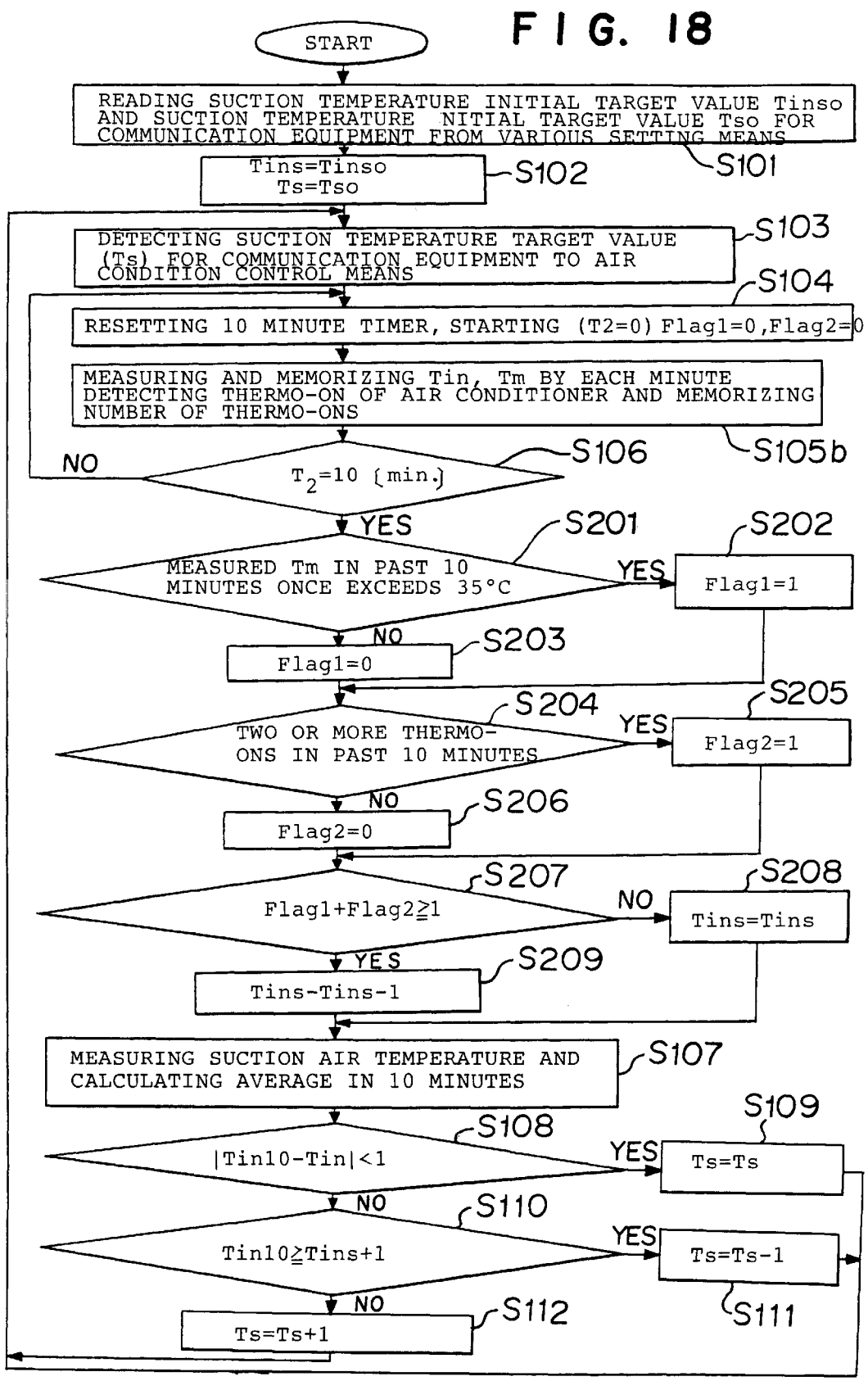
FIG. 18 is a flowchart illustrating a control by another cooling control means according to Embodiment 3 of the present invention.
Figure 19:
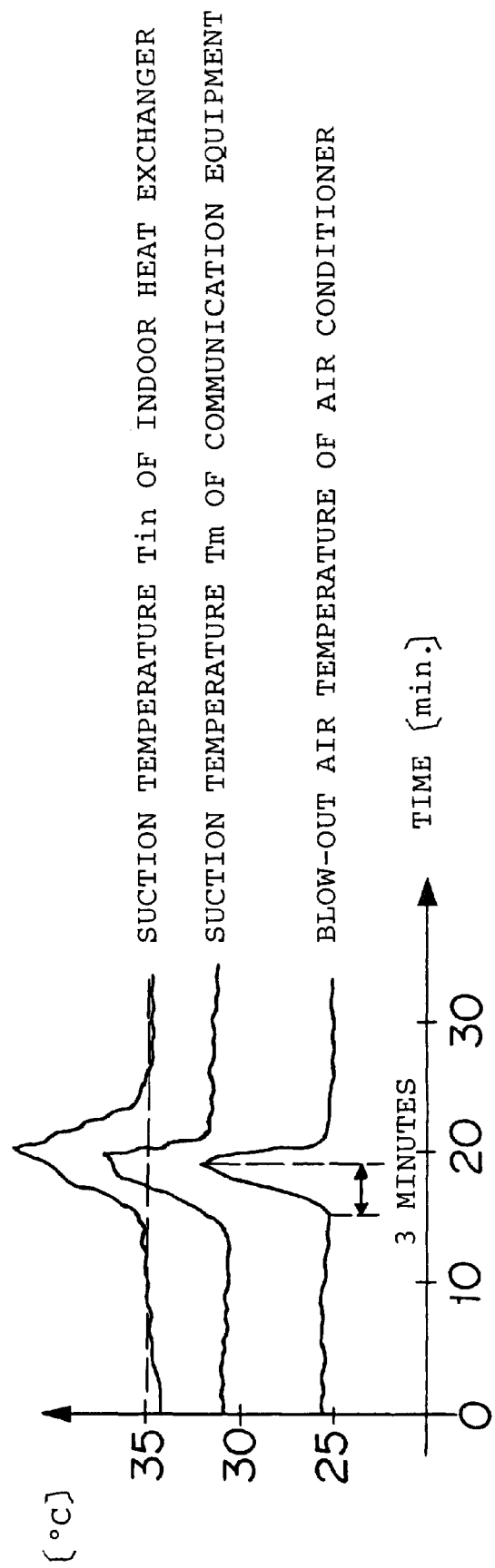
FIG. 19 illustrates a state of thermo-off according to Embodiment 3 of the present invention.

In the next, another example will be described. FIGS. 13 and 14 respectively illustrate a structure and a block chart of this example. A flowchart for controlling is illustrated in FIG. 18. As described in reference of FIG. 17, when the calorific value of the communication equipments and the cooling capability of the air conditioner are balanced, the control, described in the prior example, can be adopted. However, the air condition control means 21d of the air conditioner is in a thermo-off condition when the suction temperature Tm for the communication equipments becomes lower than the suction temperature target value Ts for the communication equipments by a predetermined value. This state is illustrated in FIG. 19. In this case, there are possibilities of:

(1) causing the suction temperature Tm for the communication equipments to temporarily outstrip the suction temperature target value Ts for the communication equipments; and (2) adversely affecting the lifetime of the air conditioner because frequent thermo-ons and thermo-offs occur.

Especially, as for (2), when the suction temperature Tin is increased as high as possible so as to attain the aim of the control according to this embodiment, the suction temperature Tm into the communication equipments is resultantly increased. When the suction temperature target value Ts for the communication equipments is high, a time that the suction temperature Tm for the communication equipments reaches by decreasing to the suction temperature target value Ts for the communication equipments after starting to cool by making the air conditioner thermo-on.

Further, it is generally necessary to control the air conditioner for protecting the compressor, wherein the thermo-on should be prevented for three minutes. Because a cooling function is stopped for the three minutes, a temperature of the communication station is increased as illustrated in FIG. 19. Although a tendency of the increment depends on the calorific value of the communication equipments inside the communication relay station, when the calorific value is constant, a temperature to be gained inside the communication relay station is high as the suction temperature target value Ts for the communication equipments is high because of the period between the thermo-off and the thermo-on. In general, when an actually measured value is a target value such as the suction temperature target value Ts for communication equipments plus 1° C., an air conditioner is in a state of thermo-on, and when the actually measured value is the target value minus 1° C., the air conditioner is in a state of thermo-off, wherein even though criteria for the thermo-on and the thermo-off are changed, the above-mentioned tendency similarly occurs.

In order to solve the above-mentioned problems (1) and (2), the following process is added to the above control. When at least one of conditions that the suction temperature Tm once exceeds a certain limit value, for example 35° C., within the ten minutes and that the thermo-on occurs twice or more within the ten minutes, the suction temperature target value Tins is decreased by 1° C.

Such an operation will be described in reference of FIG. 18. An explanation, already have described in the example in FIG. 15, is omitted. The air condition control means 21d judges the thermo-on and thermo-off in the air conditioner. In case of the thermo-on, the thermo-on is reported to the target value determining means 20d, wherein the target value determining means 20d counts the number of the thermo-ons, and the memory 20e memorizes the information and a detected value of the suction temperature Tm for the communication equipments in S105b. After a lapse of ten minutes, in S201, the target value determining means 20d checks whether or not Tm at least once exceeds 35° C. during the ten minutes or not by calling out the detected value out of the memory. In S202 and S203, Flag is set to be 1 when Tm has thus exceeded. In S204, the target value determining means 20d checks whether or not two times or more thermo-ons have occurred during the ten minutes. In case of the two times or more, Flag 2 is set to be 1 in S205 and S206. In S207, it is judged whether or not at least one of Flag and Flag2 is 1. If so, in S209, the target value Tins of the suction temperature is decreased by 1° C. Tins is maintained to be the same when both of the flags are 0 in S208. After determining the suction temperature target value Tins by the target value determining means 20d, the suction temperature target value Ts for the communication equipments for controlling next ten minutes is determined in S107 through S112, similar to those in the above embodiment, based on the average value Tin10 of the suction temperatures in the ten minutes after determining the suction temperature target value Tins by the target value determining means 20d. This procedure is repeated in a similar manner to that described in the above embodiment.

In this example, it can be misunderstood that a running efficiency is in a tendency of deteriorating by decreasing the suction temperature target value Tins. However, this makes the air conditioner run with a best efficiency and without a danger of generating moisture condensation if a presupposition of controlling in the present invention that the suction temperature for the communication equipments is maintained to be a predetermined value or less is satisfied, wherein the control is based on a worm's eye view.

In the next, another example of this embodiment will be described.

In the above-described two examples of Embodiment 3, the control means for determining the target value, by which a stable usage is obtainable for a certain condition of the load. In an actual application, because there is a case that the operation is troubled, for example, moisture condensation occurs in the communication station and a usable temperature range of the air conditioner is escaped, by decreasing or increasing the suction temperature target value Tins and/or the suction temperature target value Ts without limit.

Figure 20:
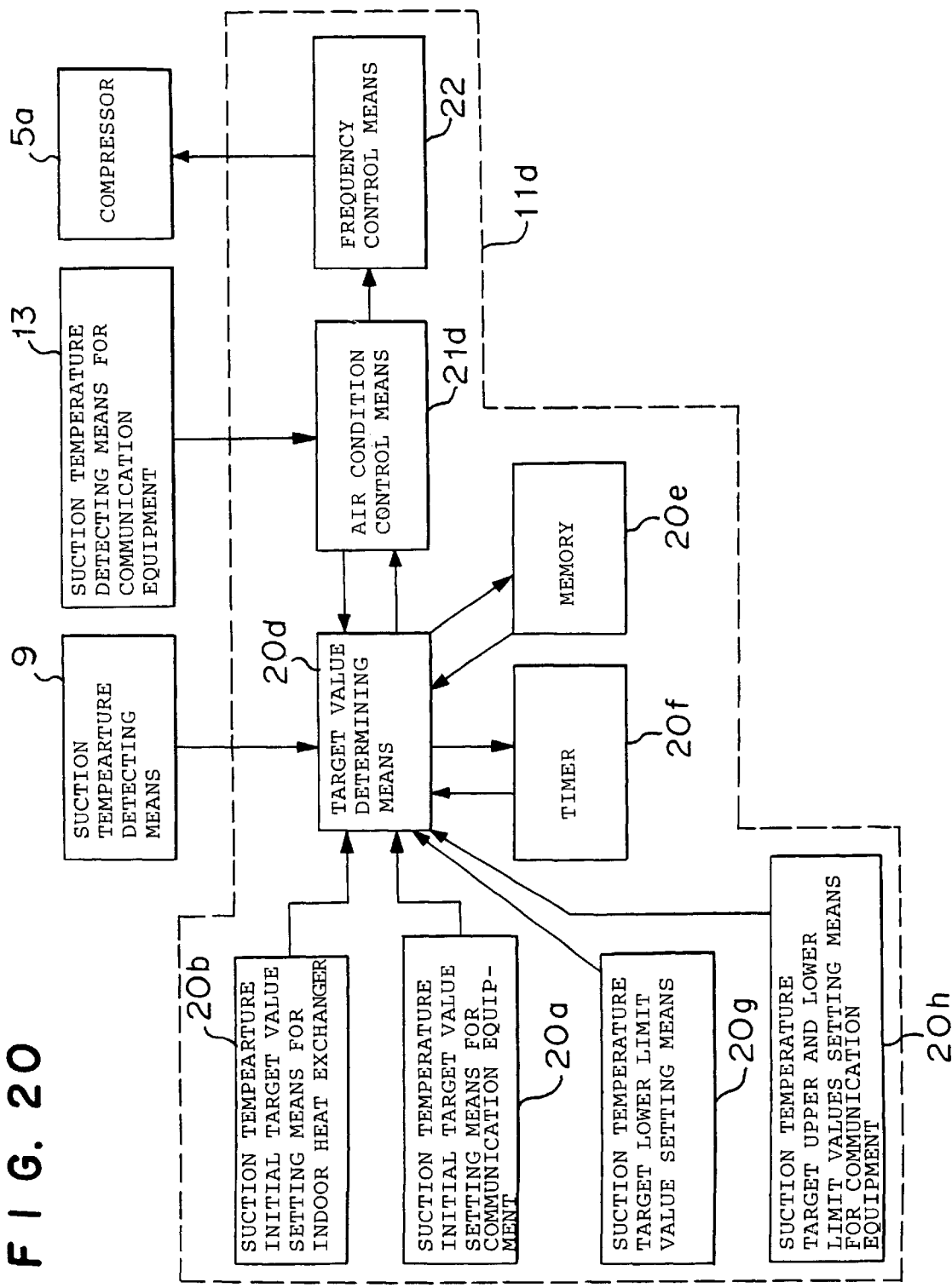
FIG. 20 is a block chart illustrating another cooling control means according to Embodiment 3 of the present invention.
Figure 21:
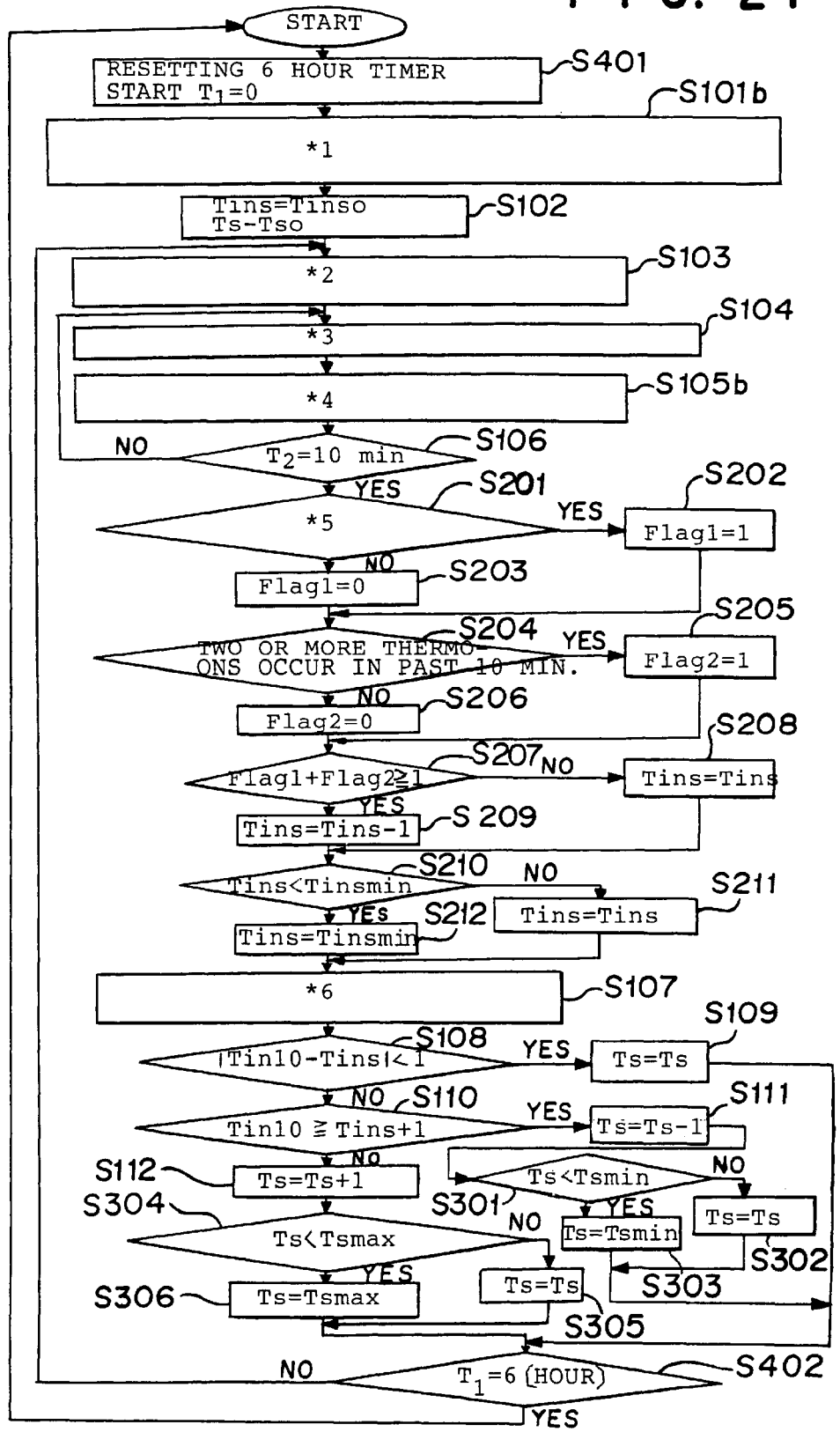
FIG. 21 is a flowchart illustrating a control by another cooling control means according to Embodiment 3 of the present invention.

A structure of the system is illustrated in FIG. 13, and a block chart is illustrated in FIG. 20 as in the above examples. In FIG. 20, numerical reference 20g designates a suction temperature target lower limit value setting means; and numerical reference 20h designates a suction temperature target upper limit and lower limit values setting means. The cooling control means 11d is constructed by adding the suction temperature target lower limit value setting means 20g and the suction temperature target upper and lower limit value setting means 20h to the above-mentioned 11c. In use of a flowchart illustrated in FIG. 21, points different from described above will be described. An explanation of the portions same as described above is omitted. In S101b, a lower limit value Tinsmin of the suction temperature target value, set by 20g, and a lower limit value Tsmin and an upper limit value Tsmax of the suction temperature target value, both set by 20h, are read. It is detected for ten minutes like the above example. After determining the suction temperature target value Tins depending on a value of the flag, it is compared whether or not the determined value Tins is smaller than the lower limit value Tinsmin in S210. If small, Tsin=Tsmin in S212. If large, the determined value Tins is used as in S212. After determining the suction temperature target value Ts by comparing an average value of the suction temperatures for the ten minutes with the suction temperature target value, the suction temperature target value Ts is compared with the upper limit value Tsmax and the lower limit value to determine whether or not the suction temperature target value Ts exceeds the upper limit value Tsmax or is smaller than the lower limit value Tsmin, respectively in S304 and S301. If exceeds the upper limit value, in S306, the target value Ts is equal to Tsmax. If smaller than the lower limit value, in S303, Ts is equal to Tsmin. If between the upper limit value and the lower limit value, in S302 and S305, the determined Ts is used. Meanwhile, the upper limit value of the suction temperature target value of the suction temperature target value corresponds to the target initial value Tinso, set by the suction temperature target initial value setting means 20b.

In the above examples, the control means determines the target values enabling the stable operation. However, there is a possibility that these target values in the stabilized condition do not always realize a most stable operation depending on hours and seasons. This is because, the capability of the air conditioner is influenced by an outer air temperature and there is a change, caused by heat and so on penetrating through a wall of the casing 10. In order to deal with these problems, as illustrated in S401 and S402 in the flowchart illustrated in FIG. 21, all values are set back to initial values by every predetermined time, for example, every six hours, and a most suitable target value for the time point is searched.

Embodiment 4

Figure 22:
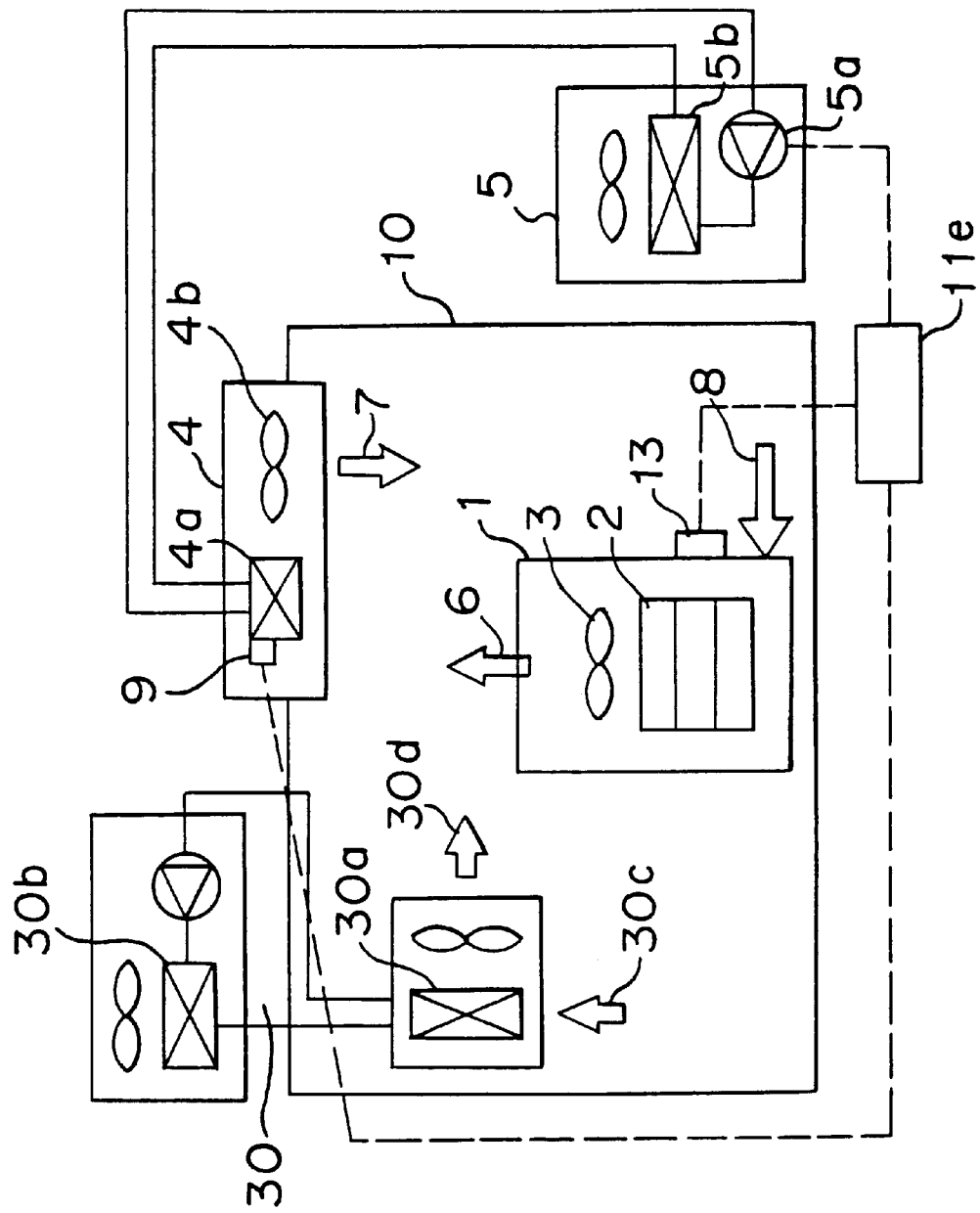
FIG. 22 illustrates a structure of a cooling control method for a communication station according to Embodiment 4 of the present invention.

Even though other air conditioners and auxiliary cooling devices such as heat pipes and boiling type cooling devices in addition to a main cooling device of the above-described air conditioner as the cooling means, the process, described in Embodiment 3, can be similarly proceeded. A system structure in this case is illustrated in FIG. 22. In FIG. 22, numerical reference 30a designates an evaporator, i.e. an air cooler of the auxiliary cooling device. Numerical reference 30b designates a condenser, i.e. a radiator, of the auxiliary cooling device. Numerical reference 30c designates an intake air into the evaporator. Numerical reference 30d designates a blowing-out air. The auxiliary cooling device 30 is constructed by the evaporator 30a, the condenser 30b, and so on. The auxiliary cooling device 30 may be located at any place inside the casing 10. As long as the auxiliary cooling device 30 is constantly and independently controlled, it is possible to process in a manner completely similar to that described in Embodiment 3, wherein the calorific value of the communication equipments 2 and removed heat by the auxiliary cooling device 30 are treated as the load inside the communication station and the removed heat is treated as an added heat. In other words, all examples described in Embodiment 3 can be applied to this structure in Embodiment 4.

Figure 23:
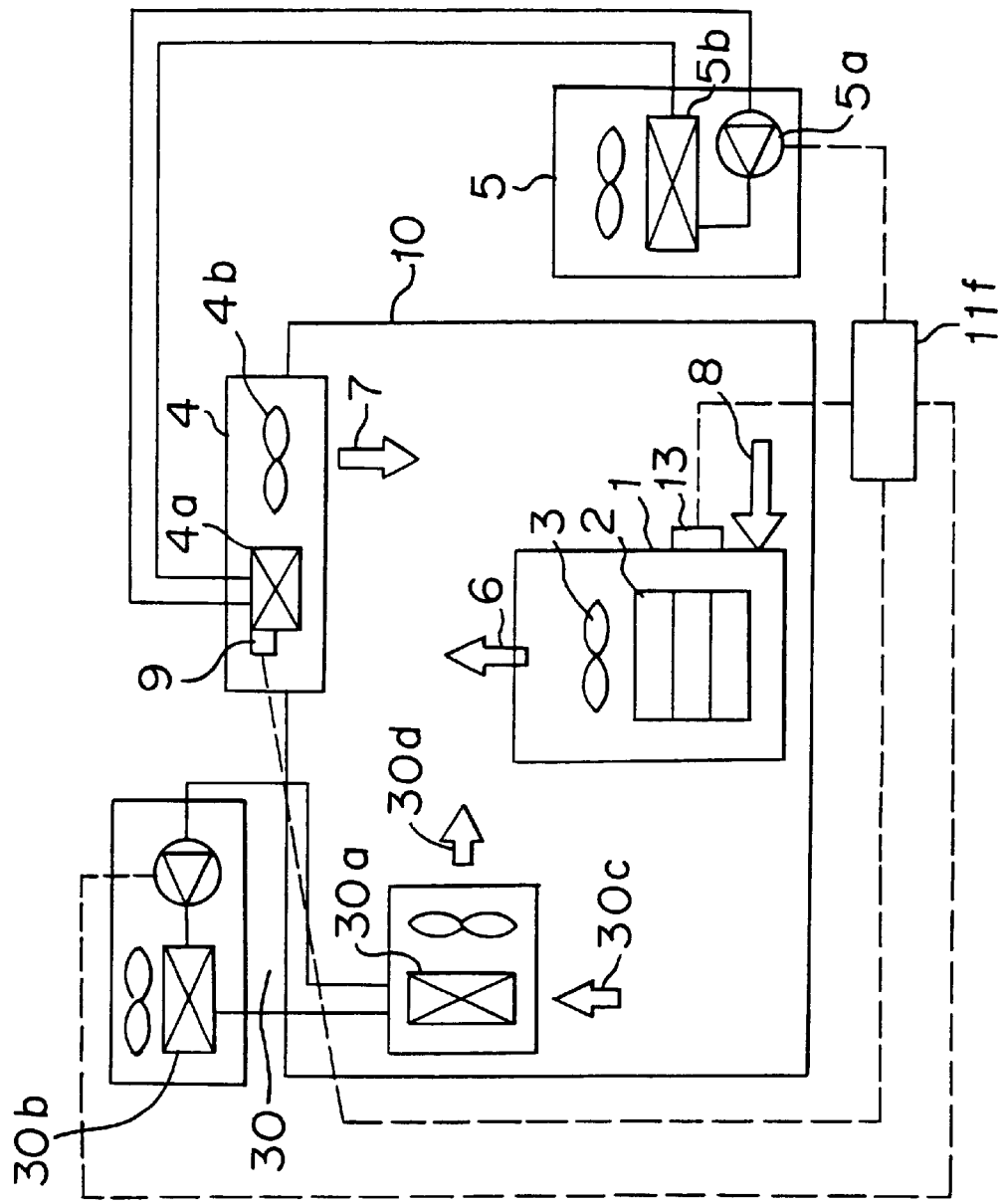
FIG. 23 illustrates a structure of another cooling control method for a communication station according to Embodiment 4 of the present invention.

Another Example of Embodiment 4 will be described. A structure is illustrated in FIG. 23. As illustrated in FIG. 23, by controlling a shut-down of the auxiliary cooling device 30 by a cooling control means 11f of the main cooling device, it is possible to more effectively operate the air conditioner. A cooling capability of a main cooling device is generally larger than that of an auxiliary cooling device. However, when both of these are independently operated, there is a case that an input is excessively increased by combining these operations, for example, the auxiliary cooling device is continued to run even though an internal load can be covered by the main cooling device. Further, when the load is small, there is a case that only the auxiliary cooling device can cover the load. In this case, by appropriately selecting these devices, an effective operation is demonstrated in consideration of an entire system.

Embodiment 5

Figure 24:
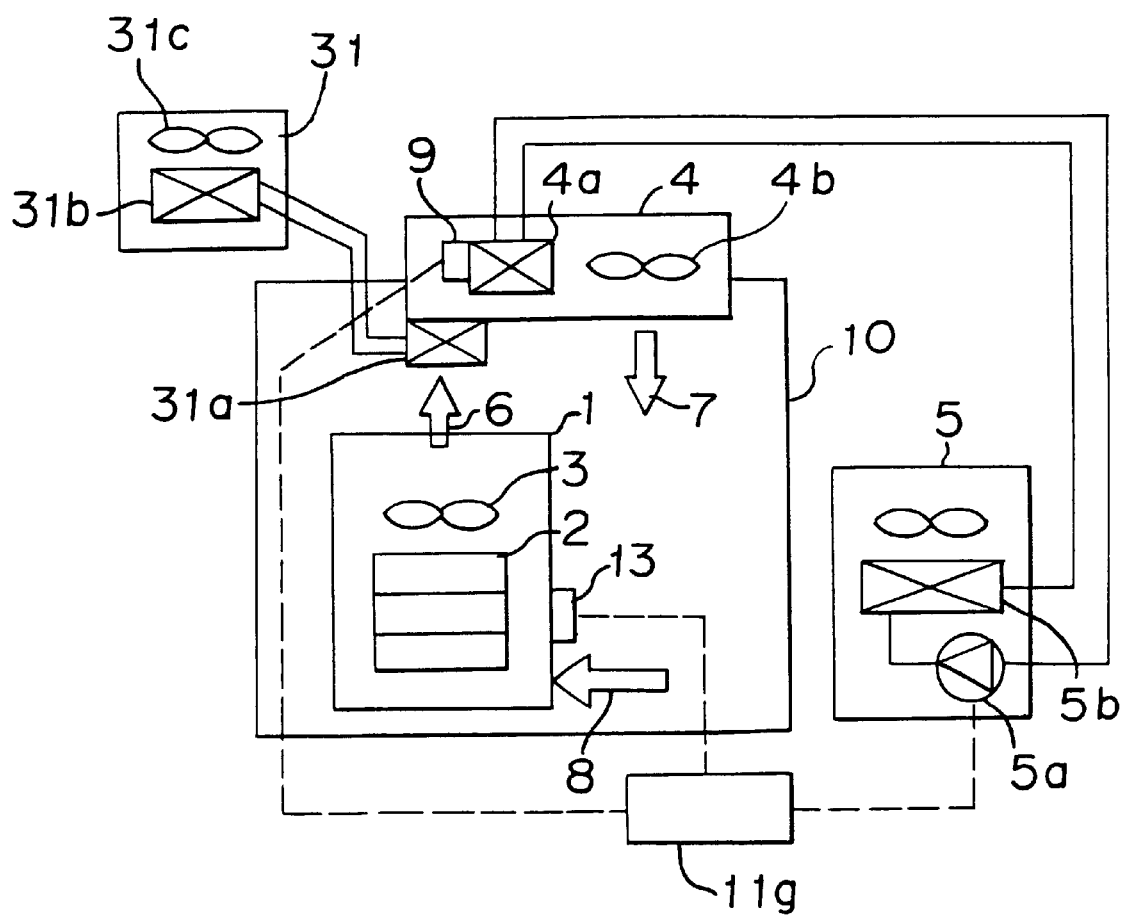
FIG. 24 illustrates a structure of a cooling control method for a communication station according to Embodiment 5 of the present invention.

A structure according to Embodiment 5 of the present invention is illustrated in FIG. 24. The auxiliary cooling device, described in Embodiment 4, is substituted by a boiling type cooling device 31 including an evaporator 31a and a condenser 31b, wherein the evaporator 31a is located on an upper stream side in the airflow path, in which the main cooling device is located. The boiling type cooling device 31 has a characteristic that as a difference between an evaporative temperature in the evaporator 31a and a condensing temperature in the condenser 31b located in an outdoor unit of the boiling type cooling device increases, a capability is further demonstrated, basically in proportion thereto. Further, the boiling type cooling device 31 is inputted from only a blower 31c. Therefore, it is possible to highly efficiently use the air conditioner by making the air path of the indoor unit commonly use for that of the air conditioner and the air path of the indoor unit commonly use for the boiling type cooling device and the air conditioner.

Therefore, for example, a suction temperature into the indoor unit, i.e. the evaporator 31a, of the boiling type cooling device 31 is set to be as high as possible while satisfying conditions that (suction temperature for communication equipment Tm)≦35° C. and (suction temperature for indoor heat exchanger Tin)≦40° C.

By controlling in a manner similar to that described in Embodiment 3, the above example can be realized. However, it is necessary to locate a detecting portion of the suction temperature detecting means 9 ahead the evaporator, i.e. the indoor heat exchanger 4a, of the air conditioner, being the main cooling device.

When the detected value by the suction temperature detecting means 9 is smaller than a predetermined value, for example 20° C. The suction air temperature into the communication equipment is controlled to be 35° C. or less. However, when it is excessively lowered, the following problems occur:

(1) There is a lower limit in a circumstance of a temperature, at which accommodated equipments are used. Generally, it is 0° C. or more, but 20° C. or more is preferable for a battery;

(2) As an indoor temperature is low, the suction air temperature approaches a dew point of an indoor air and moisture condensation is apt to occur; and (3) An energy is not properly saved. Further, other problems may occur.

In such a case, the blower of the outdoor unit of the auxiliary cooling device 31 is stopped. The shut-down of the blower of the outdoor unit demonstrates various effects in the following cases in addition to the above-mentioned situation, where a detecting means, a determining means, and so on are not specifically mentioned.

(1) An outer air temperature is lower than a predetermined temperature;

(2) A difference between detected values of the suction temperature for the boiling type cooling device and of the outer air temperature is larger than a predetermined value;

(3) A difference between the suction temperature and the blowing-off temperature, both of the heat exchanger in the outdoor unit of the boiling type cooling device, is larger than a predetermined value;

(4) A difference between an inlet temperature and an outlet temperature, both of a refrigerating tube for the outdoor unit of the boiling type cooling device, is larger than a predetermined; and (5) A detected value by the suction temperature detecting means for the communication equipments is lower than a predetermined temperature.

Further, in the following cases, corresponding measures are adopted instead of stopping the blower in the outdoor unit.

At first, if there is a danger that an air conditioner can not be restarted after once stopping a blower of an outdoor unit because snow falls and piles up, the following measures are adopted.

(1) Decreasing but not stopping the number of revolution of the blower in the outdoor unit;

(2) Without stopping the blower in the outdoor unit, the blowing by the indoor unit of the main cooling device is intermittently operated; and (3) Without stopping the blower in the outdoor unit, the number of revolution of the blower in the indoor unit of the main cooling device is decreased.

Further, when a difference between the outdoor air temperature and the suction air temperature for the communication equipments is not sufficiently kept, because there is a danger that the capability of the boiling type cooling device is inferior to the input, namely a COP becomes less than 1, the blower in the outdoor unit of the boiling type cooling device is stopped, whereby an energy is saved. For example, when the outdoor air temperature is 10° C. or more and snow does not pile up, a temperature difference is measured, and if it is 1° C. or less, the outdoor unit is stopped.

In Embodiments 3, 4, and 5, even though a plurality of air conditioners, i.e. main cooling devices, exist in the casing 10 of the communication relay station, or a total number of air conditioning apparatuses, i.e., main cooling devices, and auxiliary cooling devices is plural, it is possible to determine a most suitable operation with respect to a condition of heat from communication equipments accommodated in the communication relay station by starting a process from initial values respectively of the main cooling devices. In case of the plurality of cooling devices, there is a possibility that cooling functions interfere each other. However, the most suitable state can be automatically determined in consideration of a relationship between the plurality of cooling devices.

However, the suction temperature target value Tins of the main cooling device can only be decreased for the operation. This is because, a characteristic of the control is to decrease the suction temperature target value Tins from the initial value, for example, 35° C., of the suction temperature target value Tins while searching a maximum value, which does not causes problems.

There is a case that a calorific value in the communication relay station abruptly changes depending on a condition of the communication. However, it does not largely change in general, even though some changes stationary occur. Further, a capability of boiling type cooling device, used as the auxiliary cooling device, changes depending on an outer air temperature. Accordingly, a state of various target values, attained after the above-mentioned process started at a certain time point, does not always most suitable values at other time points. Since it is not processed to increase the suction temperature target value Tins, all target values are returned to initial values at a certain time point, e.g. after six hours from starting a previous process, and after six hours from any change of the suction temperature target value Tins, and a process for acquiring the most suitable state, whereby the most suitable operation is realized.

In the above Embodiments 1, 2, 3, 4 and 5, all values concerning the temperatures, the times, and so on are given as examples and may be changed depending on conditions.

Embodiment 6

An operation of the cooling control method for the communication station according to Embodiment 6 will be described in reference of FIGS. 1 and 2. In the cooling control method for the communication station, the suction air temperature in the communication equipments 2 is controlled to be within a normal temperature by supplying a predetermined amount of the suction air 8 to the communication equipments 2 by the fan 4b. In general, the temperature of the suction air 8 is controlled to be 20° C. or less. The suction air 8 is heated after cooling the communication equipments 2, sucked into the indoor unit 4 as the suction air 6, cooled by the indoor heat exchanger 4a, returned to the casing 10 as the blowing out air 7, and again provided to cool the communication equipments 2 as the suction air 8 for the communication equipments. The cooling control means 11a controls the temperature of the suction air 8 to be the set temperature, e.g. 20° C., or less based on outputs from the suction temperature detecting means 13 for the communication equipments and the electric power detecting means 12. Provided that the airflow rate by the fan 3 is 40 m$^3$/min and the electric power detected by the electric power detecting means 12 is 12 kW, the consumption electric power and the calorific value is substantially the same in the communication equipments 2, of which electric power consumption is consumed mostly by electronic circuit board, whereby a temperature difference $\Delta T$ between the suction air 6 and the suction air 8 becomes $\Delta T$=(electric power consumption)/(airflow rate×air density×specific heat of air at constant pressure). The electric power consumption is 12 kW, the airflow rate is 40 m$^3$/min, the air density is 1.2 kg/m$^3$, and the specific heat of the air at constant pressure is 1.01 kJ/(kg.K), whereby $\Delta T$=15 deg. Provided that the temperature of the suction air 8 is 20° C., the temperature of the suction air 6 becomes 20° C.+$\Delta T$=20° C.+15 deg=35° C. When the airflow rate by the fan 4b in the indoor unit is 40 m$^3$/min, in order to supply the suction air 6 as the suction air 8 after cooling to be 20° C., a capability as much as 12 kW becomes necessary. It is supposed that the capability of the air conditioner follows an actual calorific load by detecting the electric power consumption by the communication equipments and controlling the capability. However, the blowing-out air 7 in the indoor unit is mixed with an ambient atmosphere in the casing and served as the suction air 8 for the communication equipments, whereby the temperature of the suction air 8 does not become the above-mentioned temperature. In order to correct this, a requisite capacity of the compressor is calculated so a to make the suction air 8 basically have the set target value from the suction air temperature target value setting means 20 by comparing the temperature outputted from the suction air temperature detecting means 13 for the communication equipments and the set target value. Further, an upper limit of a maximum frequency of the compressor is calculated from an electric power detected by the electric power detecting means 12. Then the requisite capacity is corrected and the compressor 5a is controlled through the frequency control means 22 upon a command of frequency outputted from the air condition control means 21a.

FIG. 3 is a flowchart for illustrating a control operation by the cooling control means. The air condition control means 21a confirms a frequency f currently outputted to the compressor 5a.

In the next, the suction temperature detecting means 13 for the communication equipments checks the temperature Tm of the suction air 8 and the set temperature Ts of the suction air 8 in step S2. When these are not equal, in step S3, it is compared whether or not the temperature Tm exceeds the set temperature Ts. When the temperature Tm exceeds the set temperature Ts, in step S5, the frequency of the power source for the compressor 5a is increased through the frequency control means 22. When the temperature Tm does not exceed the set temperature Ts, in step S6, the frequency of the power source for the compressor 5a is decreased through the frequency control means 22. When the temperature Tm equals to the set temperature Ts in step S2, in S4, the frequency is unchanged in step S7, an upper limit fmax of the frequency of the compressor is operated by the air condition control means 21a.

The upper limit fmax is obtained from a function f(w) having a variable of the output W from the electric power detecting means 12. This relation is set, for example, as follows:

$$f(w)=13.7(W-6)+30$$

This is a case that a characteristic of the compressor 5a is such that 12 kW at 112 Hz and 6 kW at 30 Hz, and the capacity of the compressor linearly changes in frequencies between 112 Hz and 30 Hz. In step S8, fmax operated from f(w) and the calculated $f_1$ are compared. When $f_1$ is larger than fmax, the frequency of the compressor is fmax, and when $f_1$ is fmax or less, the frequency of the compressor is $f_1$ in steps S9, S10, and S11. The frequency of the compressor is controlled as described.

There is a case that the calorific value of the communication equipments 2 abruptly changes. In such a case, it is insufficient to control using only the output signals from the suction temperature detecting means 13 for the communication equipments, which output signal is obtained as a result of the change. Therefore, the output signal from the electric power consumption detecting means 12, causing a change of the temperature Tm, is previously obtained to control the air condition, whereby a stable control with a good follow-up capability is achieved.

FIG. 4 is a flowchart illustrating the cooling control method according to another example of Embodiment 6 of the present invention. The procedure until steps S9 and S10 is similar to that described above. The cooling control means in this cooling control method is illustrated in FIG. 2. After calculating the frequency $f_1$ in the step S9 or S10, in step S21, the electric power consumption W, i.e. output from the electric power detecting means 12, at the time point is compared with the set value $f_1$ of the electric power consumption previously set. When W>Ws, in step S22, the frequency of the compressor 5a is set to be $f_1$. When W>Ws, in step S22, the frequency of the compressor 5a is set to be $f_1$. When W≦Ws, the capacity of the compressor is minimized. This means the frequency of the compressor is minimized without avoiding the operation of the compressor, or a refrigerating circuit is formed to bypass a part of a refrigerant flowing into the outdoor heat exchanger 5b, wherein a bypass circuit is not illustrated in FIG. 1. The set value Ws is made a little larger than the minimum capacity of the air conditioner. For example, when the minimum capacity of the air conditioner is 6 kW, the set value Ws is 7 kW. When the calorific value of the communication equipments is reduced in the first example of Embodiment 6, there is a case that the compressor is stopped, i.e. thermo-off, when the capacity of the air conditioner is succeedingly reduced and the calorific value becomes less than the minimum capacity. However, in the example, a determination in the step S21 is further added, and the capacity of the compressor is minimized before the calorific value is reduced less than the minimum capacity of the air conditioner, whereby the thermo-off seldom occurs even in such a case. Repetitions of thermo-ons and thermo-offs do not only shorten a lifetime of a compressor but also causes moisture condensation in a casing, these problems can be prevented in this example.

Embodiment 7

Hereinbelow, an example according to Embodiment 7 of the present invention will be described.

Figure 25:
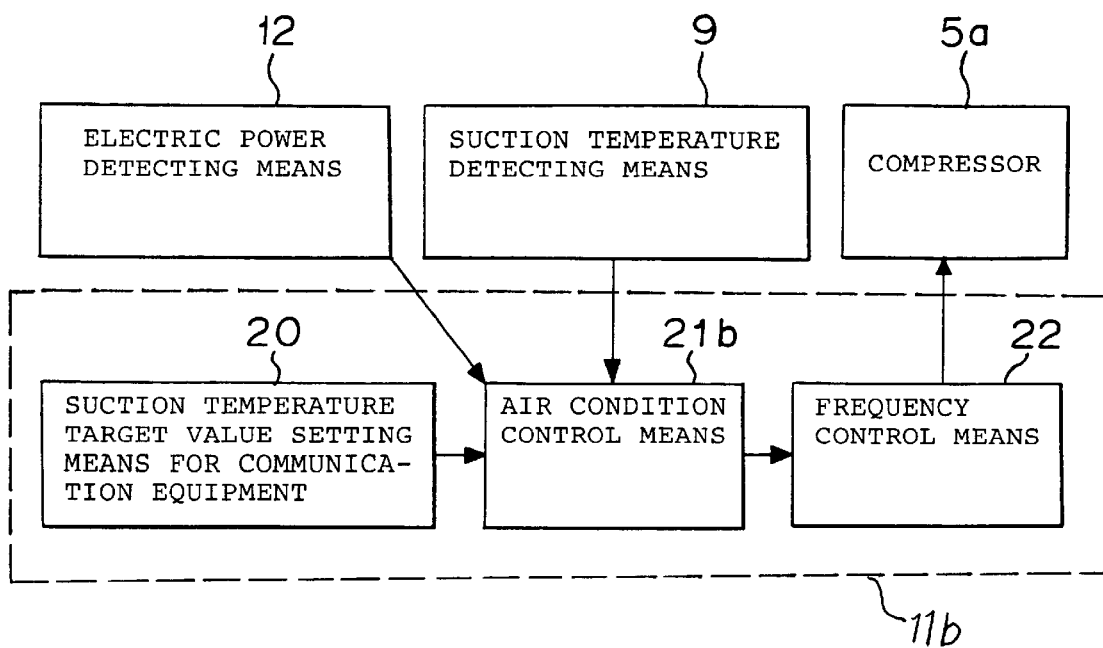
FIG. 25 is a block chart illustration a cooling control means according to Embodiment 7 of the present invention.

FIG. 6 illustrates a structure of the cooling control method for the communication station according to Embodiment 7 of the present invention. FIG. 25 is a block chart illustrating the cooling control method according to Embodiment 7. In FIGS. 6 and 25, numerical references the same as in FIGS. 1 and 2 designate the same or similar portions and description of these portions is omitted. Numerical reference 11b designates the cooling control means for controlling the cooling capability of the air conditioner.

Figure 26:
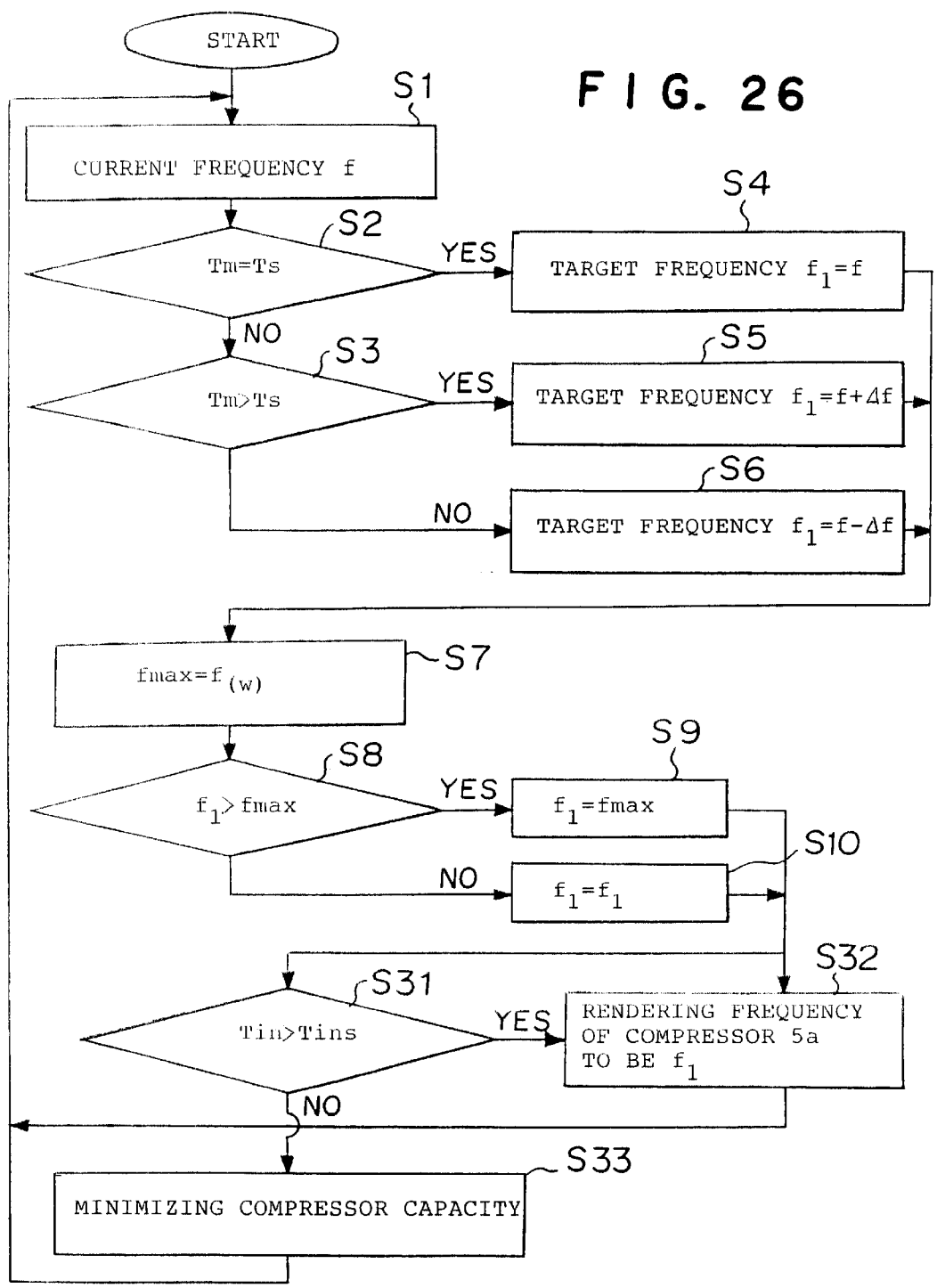
FIG. 26 is a flowchart illustrating an operation of the cooling control means according to Embodiment 7 of the present invention.
Figure 27:
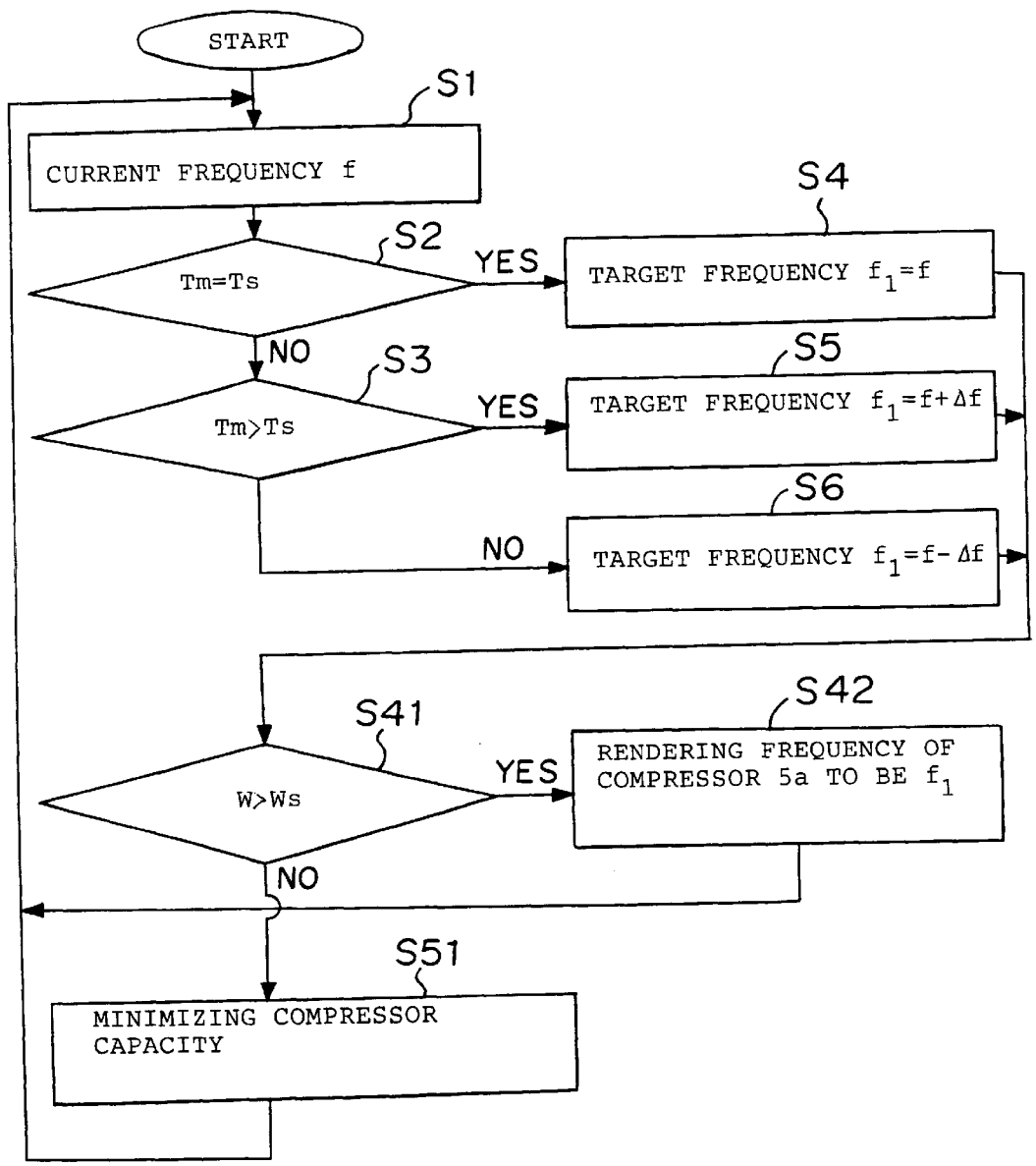
FIG. 27 is a flowchart illustrating an operation of a cooling control method according to Embodiment 6 of the present invention.

An operation of the cooling control method for the communication station according to Embodiment 7 will be described in reference of Figures. FIG. 26 is a flowchart illustrating an operation of the cooling control method 11b. A procedure until the steps S9 and S10 is similar to that in the examples of Embodiment 6. After calculating the frequency f, in the step S9 or S10, in step S31, a suction temperature Tin, i.e., an output from the suction temperature detecting means 9, of the indoor unit at that time is compared with a set value Tins of the suction temperature previously set. When Tin>Tins, in step S32, the frequency of the compressor is set to be $f_1$. When Tin≦Tins, a capacity of the compressor is minimized. This means the frequency of the compressor is minimized within an operable range for the compressor, or a refrigerating circuit is formed to bypass a part of a refrigerant flowing into the outdoor heat exchanger 5b, wherein a bypass circuit is not illustrated in FIG. 6.

The set value Tins is set as follows. Step S31 in FIG. 26 has similar significance to the step S21 in FIG. 4. In other words, as long as the temperature Tin of the suction air 8 for the communication equipments is constant, there is a relationship between the calorific value of the communication equipments and the suction air Tin for the indoor unit:

$$Tin \propto (\text{calorific value of communication equipment})$$

Accordingly, it is possible to substitute the suction temperature for the electric power consumption, described in the example of Embodiment 6 in reference of FIG. 4. For example, the set value Tins is Tin corresponding to an electric power consumption of 7 kW. A temperature difference ΔT between the suction air 6 and the suction air 8 with respect to the electric power consumption 7 kW becomes ΔT=8.7 deg based on the above-mentioned constants and equations. When Tm=20° C., $$Tin=Tm+\Delta T=28.7° C.$$

Accordingly, Tins may be set to be 28.7° C.

Embodiment 8

Figure 28:
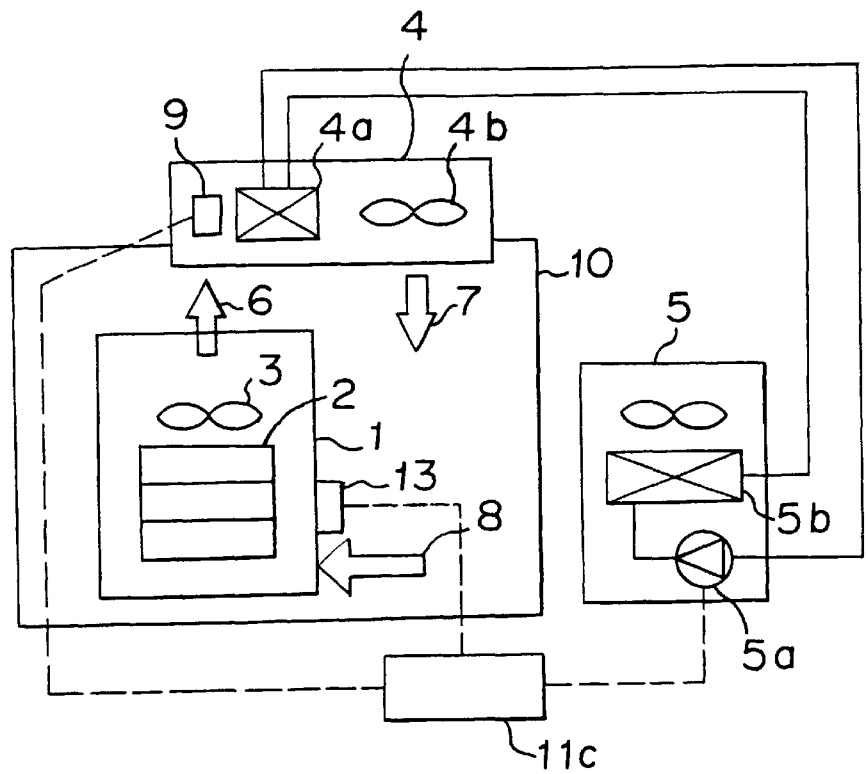
FIG. 28 illustrates a structure of a cooling control method for communication station according to Embodiment 8 of the present invention.
Figure 29:
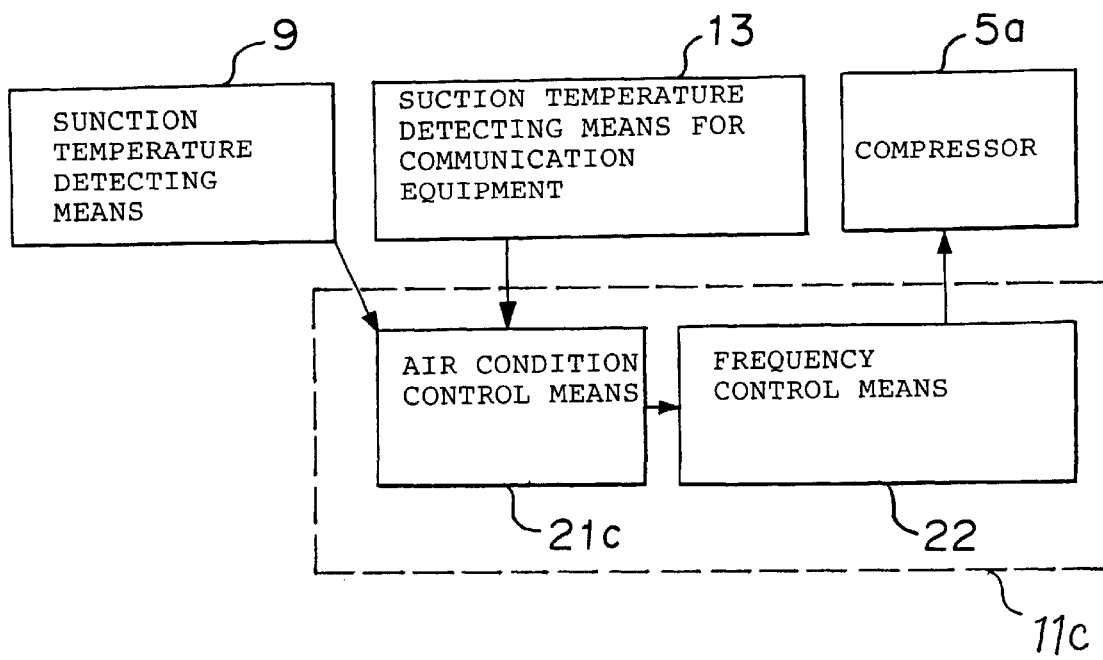
FIG. 29 is a block chart illustrating a cooling control means according to Embodiment 8 of the present invention.

In the above-mentioned examples of the embodiments, there are relationships between the calorific value of the communication equipments and the suction temperature. Therefore, the output from the electric power detecting means 12 and the output from the suction temperature detecting means may be exchanged. This case is illustrated in FIGS. 28 and 29 as Embodiment 8.

It is also possible to modify the process of designating the upper limit value of the frequency in the example of Embodiment 6 to be step S51, in which the output W from the electric power detecting means 12 is compared with the set value Ws, and when W≦Ws, the capacity of the compressor is minimized.

By this, while maintaining the function of preventing moisture condensation caused by repetitions of thermo-ons and thermo-offs, the structure of the cooling control method is simplified. Also in this example, the judgement in the step S41 may be based on the suction temperature not the electric power as described.

Embodiment 9

Figure 30:
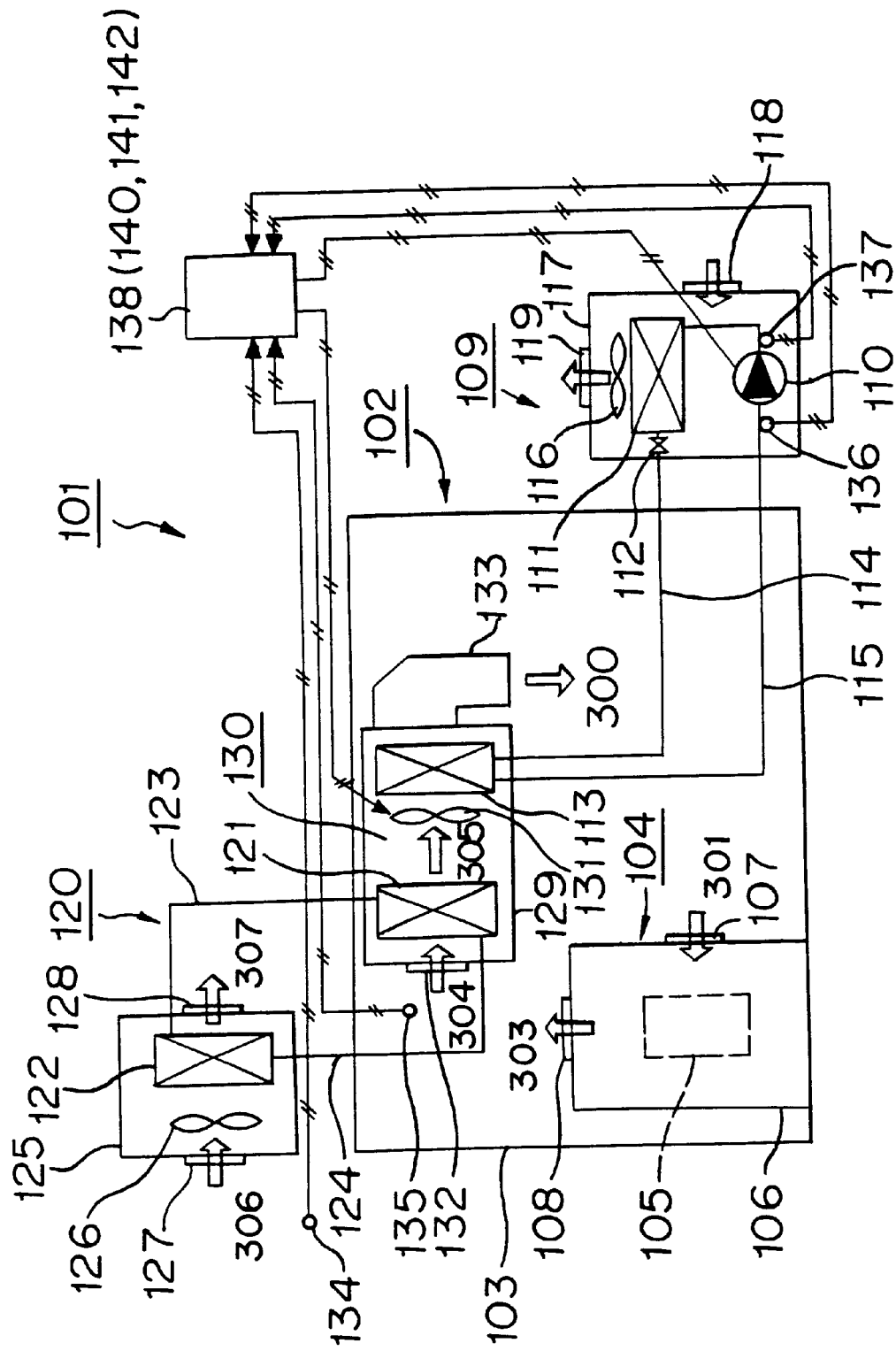
FIG. 30 schematically illustrates a structure of a cooling system for a casing of a communication station according to Embodiments 9, 11 and 12 of the present invention.
Figure 34:
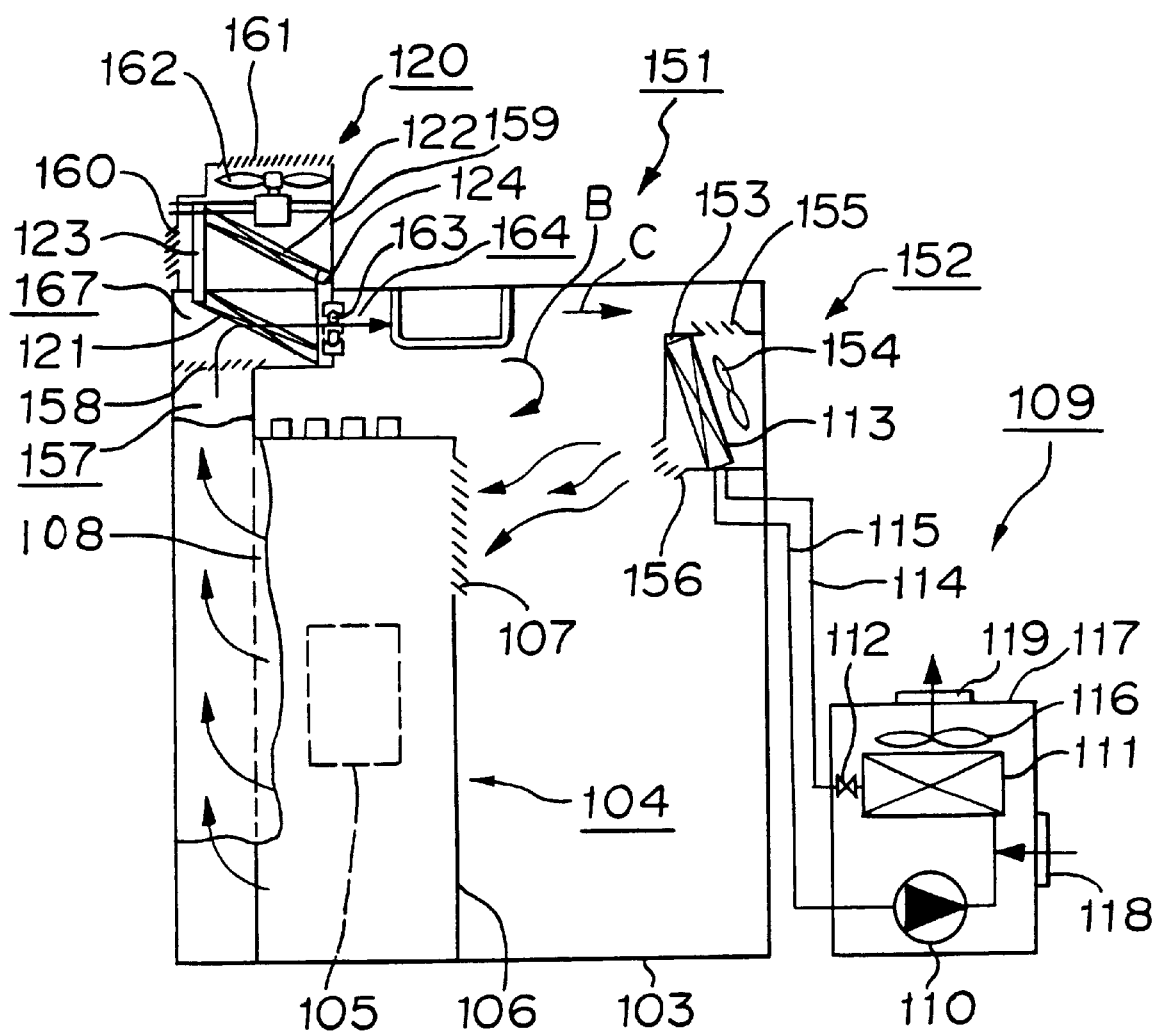
FIG. 34 schematically illustrates a structure of a conventional cooling system for a casing of a communication station.

FIG. 30 schematically illustrates a structure of a cooling system of a casing in a communication station according to Embodiments 9, 11, and 12. Constitutional elements corresponding to the conventional cooling system 151, illustrated in FIG. 34, are attached with the same numerical references, and description of these constitutional elements is omitted.

In FIG. 30, the cooling system 101 for the casing is constructed to cool inside the casing 103 in the communication station 102 forming an enclosed space using a boiling type cooler 121 of a natural circulation refrigerating circuit 120 and an evaporator 113 in a forced circulation refrigerating circuit 109, through which a refrigerant is forcibly circulated by a compressor 110. Communication equipments 104 including heat components are accommodated in the casing 103.

In the casing 103 of the cooling system 101, a common airflow path 130 is located. The common airflow path 130 includes a common case 129 shaped like a hollow box having a heat air intake port 132 for taking a heat air in the casing 103 and a cold air exhaust port 113 for blowing a cold air into the casing 103. In the common airflow path 130, the boiling type cooler 121 in the natural circulation refrigerating circuit 120, the evaporator 113 in the forced circulation refrigerating circuit 109, and a common fan 131 for blowing an air to the boiling type cooler 121 and the evaporator 113 are built.

A condenser 111 in the forced circulation refrigerating circuit 109 is installed in a condenser case 117 as an outdoor unit. The condenser case 117 is shaped like a box having an outer air intake port 118 and an outer air exhaust port 119. Further, the condenser case includes the condenser 111, the compressor 110, a refrigerant choke valve 112, and a fan 116. The forced circulation refrigerating circuit 109 is constructed by sequentially connecting the compressor 110 in the condenser case 117, the condenser 111, the refrigerant choke valve 112, and the evaporator 113 in the common airflow path 130 through refrigerating pipes 114, 115 in an annular shape.

The condenser 122 in the natural circulation refrigerating circuit 120 is located in the condenser case 125 as the outdoor unit. The condenser case 125 is shaped like a box having an outer air intake port 127 and an outer air exhaust port 128 and includes the condenser 122 and a fan 126. In other words, the natural circulation refrigerating circuit 120 is constructed by connecting the condenser 122 in the condenser case 125 and the boiling type cooler 121 in the common airflow path 130 through a refrigerant evaporating pipe 123 and a liquid refrigerant return pipe.

An operation of the cooling system 101 for the casing in the communication relay station 102 according to the abovementioned structure will be described.

A cooling air in a position 301 on a side of an equipment case 106 is taken into the equipment case by a fan (not shown) in the communication equipments 104. The cooling air cools heat components 105, is changed to a heat air, and is blown out of the exhaust port in an upper portion of the equipment case into a position 303 inside the casing 103. Thus blown-out heat air is taken into the common airflow path 130 from a position 304 through the heat air intake port 132 by the common fan 131. In the common airflow path 130, the heat air passes through the boiling type cooler 121 to primarily exchange heat with a refrigerant in the natural circulation refrigerating circuit 120. An air subjected to the primary cooling in position 305 is sucked by the common fan 131, and passes through the evaporator 113 in its entirety, whereby the air exchanges heat with a refrigerant in the forced circulation refrigerating circuit 109. Thus cooled air is blown out into a position 300 in the casing 103 from the cooled air exhaust port 133 as a cooing air. In other words, the air cools inside the casing 103 by sequentially circulating the positions 300, 301, 302, 304 and 305 in this order.

In a refrigerant system in the natural circulation refrigerating circuit 120, a refrigerant in the boiling type cooler 121 is boiled by exchanging heat with the heat air and reaches the condenser 122 through the refrigerant evaporating pipe 123. In the condenser 122, a gas refrigerant changes to a liquid refrigerant by condensing as a result of the heat exchange with an outer air passing through the condenser case 125 from the outer air intake port 127 to the exhaust port 128 by the fan 126. The liquid refrigerant returns to the boiling type cooler 121 through the liquid refrigerant return pipe 124 by a gravity flow caused by a difference of weight density from the gas refrigerant.

On the other hand, in a refrigerant system of a forced circulation refrigerating circuit 109, a high-temperature high-pressure gas refrigerant forcibly discharged from the compressor 110 flows into the condenser 111 and cooled by heat exchange with an outer air passing through the condenser case 117 from the outer air intake port 118 to the exhaust port 119. The liquid refrigerant is depressurized by the refrigerant choke valve 112 so as to be in a gas liquid two-phase state, and reaches the evaporator 113 through the refrigerant pipe 114. The refrigerant exchange heat with the air subjected to the primary cooling in the evaporator 113 so as to be a low-pressure gas refrigerant, and returns on an intake side of the compressor 110 through the refrigerant pipe 115. The capacity of the compressor 110 is controlled based on an air temperature at the position 305 inside the common airflow path 130.

As described, according to the cooling system 101 for the casing according to this embodiment, since the boiling type cooler 121 and the evaporator 113 are positioned inside a single common airflow path 130, it is sufficient to locate one common fan 131 inside the common airflow path 130. Further, because a space for locating the fan, which is required for two units of fans in the conventional technique, is for one unit. Therefore, a fan providing a high airflow rate can be adopted as the common fan 130. Accordingly, a capability of the natural circulation refrigerating circuit 120 can be expansibly utilized. Meanwhile, the air subjected to the primary cooling by the boiling type cooler 121 is always introduced into the evaporator 113 to be sufficiently cooled. Therefore, there is no danger that bypassing of an air and a short cycle occurs in the casing 103 as in the conventional technique, whereby a cooling efficiency becomes high and an energy can be saved. Further, because the heat air is not directly sucked into the evaporator 113, it is possible to prevent failures of the forced circulation refrigerating circuit 109. Further, the heat air guiding path 157, illustrated in FIG. 34 required in the conventional system, is not always necessary.

As described, it is possible to reduce the number of fans and a running cost, whereby the energy can be saved; a total cooling capacity in the air conditioning system is reduced; reliability of the total cooling system is improved; and a noise can be reduced by reducing a running capacity of the compressor 110.

Incidentally, in order to improve the efficiency of the system, or preventing moisture condensation in the casing 103, it is effective to operate the system by increasing the temperature inside the casing as high as possible as long as an ambient temperature required in using the communication equipments 104 and so on. However, when the temperature inside the casing is increased, for example 30° C. or more, an air temperature in the position 303, where the air is blown out of the equipment case 106, is increased, for example 40° C. If the air having such a temperature is directly sucked into an ordinary indoor unit of an air conditioner, for example the evaporator case 153 in FIG. 34, an assured range for operation of the air conditioner indoor unit, for example 35° C., overpassed. As described, by pairing and arranging the boiling type cooler 121 and the evaporator 113, the suction temperature for the evaporator 113 is kept within the assured range, and succeedingly the reliability of a cooling system is improved.

Figure 32:
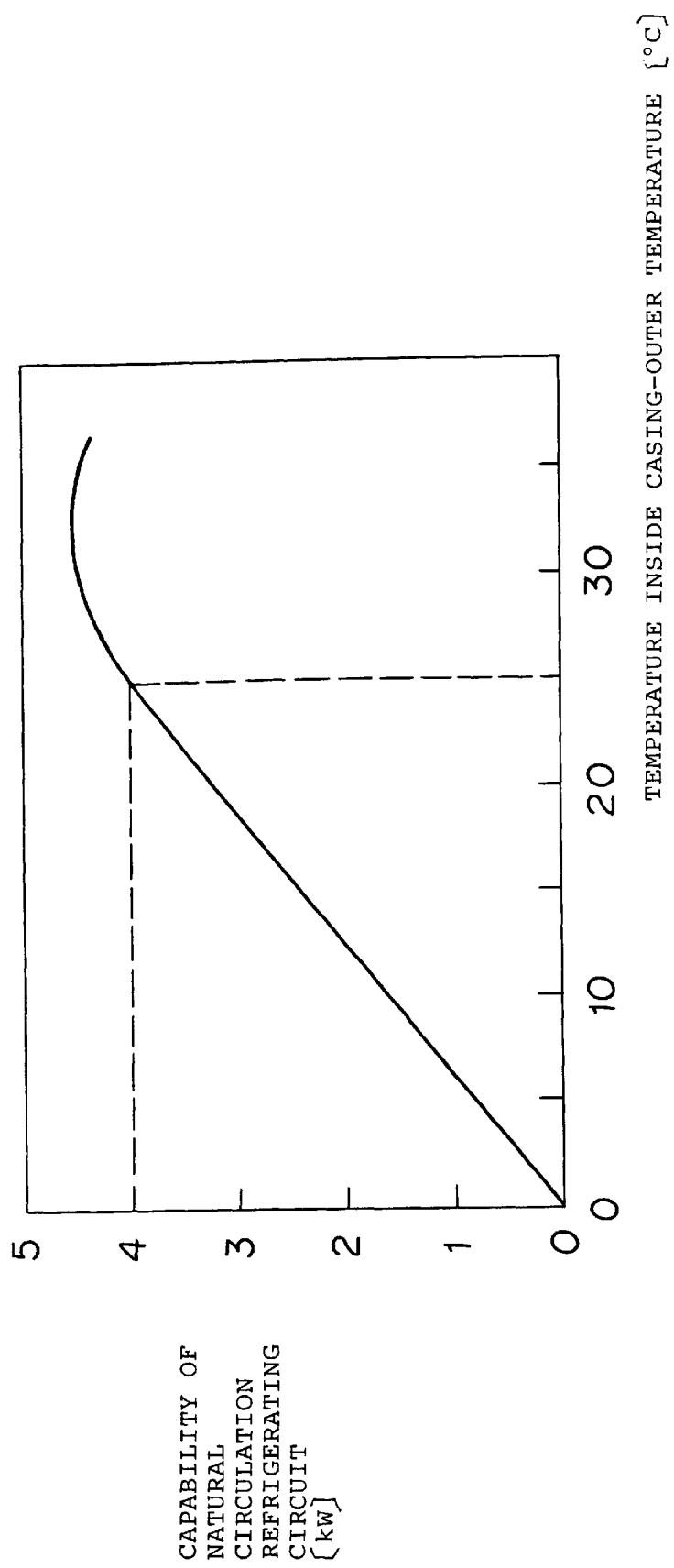
FIG. 32 is a graph showing a relationship among a capability of a natural circulation refrigerating circuit, an outer temperature, and so on in a cooling system for a casing of a communication station according to Embodiment 11 of the present invention.

Further, the boiling type cooler 121 in the common case 129 as a function of demonstrating a high capability as a difference between a temperature of the suction air in the position 304 and a temperature of an outer air sucked into the condenser 122 in the position 306 as illustrated in FIG. 32. Therefore, it is efficient to exchange heat with a heat air positioned possibly closest to the heat components 105. For this, it is preferable to arrange the heat air intake port 132 in the common case 129 at a position just above the heat components in this case, the temperature of a heat air blown out of the exhaust port 108 of the communication equipments 104 is substantially maintained and becomes the same as that of an air, sucked into the common airflow path 130 in the position 304.

Embodiment 10

Figure 31:
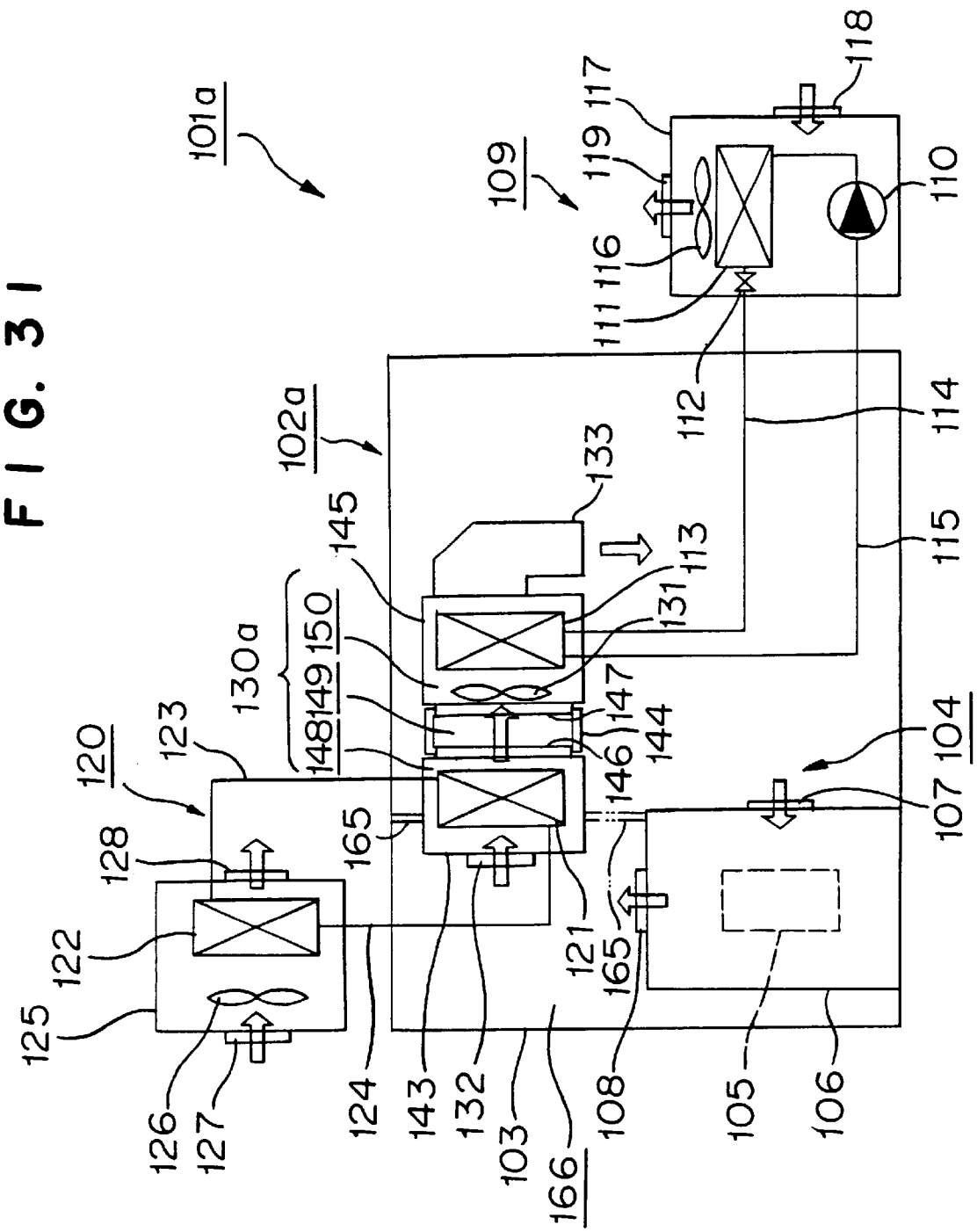
FIG. 31 schematically illustrates a structure of a cooling system for a casing of a communication station according to Embodiment 10 of the present invention.

FIG. 31 schematically illustrates the cooling system for a casing of the communication station according to Embodiment 10 of the present invention. The cooling system 101a of a communication station 102a differs from the above-described cooling system 101 at a point that the common airflow path is constructed by an airflow path 148 having a built-in boiling type cooler 121, an airflow path 150 on the evaporator side having a built-in evaporator 113, and a connecting airflow path 149 for connecting the airflow path 148 and the airflow path 150. More specifically, an exhaust port 146 of a cooler case 143 accommodating the boiling type cooler 121 is connected to an intake port 147 of an evaporator case 145 accommodating the evaporator 113 through a connecting duct 144, wherein a common airflow path 130a is formed inside these. Because an operation of the cooling system 101a for the casing is substantially the same as that described in Embodiment 9, description is omitted.

In thus constructed cooling system 101a, it is possible to use an air conditioner, corresponding to the evaporator case 145 having the intake port 147 and a cold air exhaust port 133, the evaporator 113, and a common fan 131, positioned in the forced circulation refrigerating circuit 109 without modifications.

Meanwhile, it is possible to form a suction side space 166 by forming a separator between the equipment case 106 and the cooler case 143 and between an inside of the casing 103 and the cooler case 143. When the separator 165 is not formed, it is possible to locate a plurality of communication equipments 104 having built-in heat components 105 in a casing 103.

Embodiment 11

In the cooling system 101 for the casing according to Embodiment 11, as illustrated in FIG. 30, a control device 138 composed, for example, microcomputers and so on is located. In this embodiment, the control device 138 has a function of a compressor control means 140 to be described below. Further, the cooling system 101 includes a temperature detecting means 134 for detecting an outer air temperature, and a temperature detecting means 135 for detecting a temperature inside the casing, preferably a temperature of airs in the vicinity of the exhaust port 108 of the equipment case 108 and the heat air intake port 132 of the common case 129.

When the temperature detecting means 134 detects an outer air temperature, and the temperature detecting means 135 detects the temperature inside the casing, the compressor control means 140 operates a difference between the detected temperature inside the casing and outer air temperature. Succeedingly, the compressor control means 140 stops an operation of the compressor 110 in the forced circulation refrigerating circuit 109 based on the obtained temperature difference.

Specifically, a capability (kW) of the natural circulation refrigerating circuit 120, illustrated in FIG. 32, and data about the temperature difference between the temperature inside the casing and the outer air temperature are previously set and memorized in a memory, and a requisite capability of the natural circulation refrigerating circuit 120 is obtained from the temperature difference operated from various detected temperatures. Then, when the requisite capability of the natural circulation refrigerating circuit 120 is lower than the set values of the data under the same conditions, the compressor control means 140 forcibly stops the compressor 110 in the forced circulation refrigerating circuit 109, whereby only the natural circulation refrigerating circuit 120 is continued to operate.

In other words, in this system according to Embodiment 11, when it is sufficient to cool the inside of the casing using only the capability of the natural circulation refrigerating circuit 120, the compressor 110 is not operated regardless of the air temperature in the position 305, whereby it is possible to avoid a needless running cost for the forced circulation refrigerating circuit 109.

Meanwhile, the capability of the natural circulation refrigerating circuit 120 is enhanced as the outer air temperature is low, whereby a load to the forced circulation refrigerating circuit 109 can be reduced. For example, when the natural circulation refrigerating circuit 120 having a characteristic as in FIG. 32 is designed, a cooling capacity under a temperature difference ΔT=25° C., for example the outdoor air temperature is 15° C. and the temperature inside the casing is 40° C., is 40 kW. In other words, if the capability of the natural circulation refrigerating circuit 120 is designed based on conditions of midsummer, when the outdoor air temperature is extremely high, the running capacity on a side of the forced circulation refrigerating circuit 9 in winter seasons and intermediate seasons can be drastically reduced, whereby a running cost is reduced. It is also possible to provide ebullient cooling in the natural circulation refrigerating circuit 120 with a reduction of the capacity on the side of the forced circulation refrigerating circuit 109.

Needless to say that the structure of Embodiment 11 can be applied to not only the cooling system 101, illustrated in FIG. 30, but also the cooling system 101a, illustrated in FIG. 31.

Further, when a calorific load inside the casing scarcely changes through a year, it is possible to stop an operation of the compressor 110 based solely on the detected outer air temperature by the temperature detecting means 134. In such a case, because the temperature detecting means 135 for the casing is omitted, a structure for controlling is simplified and a cost becomes low.

Embodiment 12

In the cooling system 1 for the casing according to Embodiment 12 of the present invention, as illustrated in FIG. 30, a pressure detecting means 136 for detecting a low-pressure refrigerant pressure on a suction side of the compressor 110 and a temperature detecting means 137 for detecting a high pressure refrigerant pressure on an exhaust side of the compressor 110 are included. Further, the control device 138 has functions as a malfunction detecting means 141 for the forced circulation refrigerating circuit 109, detecting based on detected pressures respectively by the pressure detecting means 136, 137 and an operation hold means 142, which holds the common fan 131 in a running state when the malfunction detecting means 141 detects malfunctions of the forced circulation refrigerating circuit 109.

Accordingly, in the cooling system according to Embodiment 12, when a difference between the detected pressure, respectively from the pressure detecting means 136, 137, is larger than a predetermined value, the malfunction detecting means 141 detects malfunctions of the forced circulation refrigerating circuit 109. The malfunction detecting means 141 urgently stops the compressor 110. Simultaneously, the malfunction detecting means 141 continues to send an air by holding the common fan 131 in the running state. Since the natural circulation refrigerating circuit 120 is constantly operated even in such a case, an air is sent to the boiling pipe cooler 121 by the common fan 131. In other words, even though the forced circulation refrigerating circuit 109 is urgently stopped by malfunctions, an air cooled by the boiling type cooler 121 is blown into the casing 103, and a temperature inside a casing 103 is not boiled. However, it is possible to detect a refrigerant temperature on the exhaust side of the compressor instead of using the pressure detecting means 136, 137 for detecting malfunctions of the forced circulation refrigerating circuit 109. Such modification may be applied to the malfunction detecting means other than the pressure detecting means.

Embodiment 12 can be applied to not only the cooling system 101 but also the cooling system 101a in FIG. 31.

Although in the above embodiments, examples that the common airflow paths 130, 130a are built in the casing 103, the present invention is not limited to such structures. For example, the common case 129 for the common airflow paths 130, 130a, the cooler case 143, the connecting duct 144, the evaporator case 145 may be attached to an outside of the casing for connecting the heat air intake port 132 and the cool air exhaust port 133 into an inside of the casing 103.

Further, although the common fan 131 is located between the boiling type cooler 121 and the evaporator 113, the present invention is not limited to this structure. The common fan 131 may be located on an upstream side of the airflow in the boiling type cooler 121 or on the downstream side of the airflow in the evaporator 113 in the common airflow paths 130, 130a.

The first advantage of the cooling control method for a communication station according to the present invention is that the temperature of the suction air for cooling the communication equipments is rendered to be the set temperature based on the detected value by the temperature detecting means; the temperature of the suction air for the communication equipments is stabilized; and it is possible to accurately follow up the calorific value, i.e. load, caused by the operation of the communication equipments.

The second advantage of the cooling control method for the communication station according to the present invention is that it is possible to control with a good capability of following up the load and to efficiently control cooling in response to the load of the air conditioner, whereby the energy can be saved during the operation.

The third advantage of the cooling control method for communication stations according to the present invention is that frequent thermo-ons and thermo-offs are prevented to avoid the moisture condensation in the casing.

The fourth advantage of the cooling control method for communication stations according to the present invention is that the electric power consumption can be detected using an ampere meter at a cost lower than that at an electric power meter.

The fifth advantage of the cooling control method for communication stations according to the present invention is that the moisture condensation can be prevented because a blowing-out air temperature from the air conditioner is increased.

The sixth advantage of the cooling control method for communication stations according to the present invention is that a lifetime of the air conditioner is not adversely affected.

The seventh advantage of the cooling control method for communication stations according to the present invention is that it is possible to prevent troubles such that a usable temperature range for the air conditioner is outstripped.

The eighth advantage of the cooling control method for communication stations according to the present invention is that preferable control target values can be set regardless of hours and changes of the seasons, and a stable operation is obtainable.

The ninth advantage of the cooling control method for communication stations according to the present invention is that it is possible to deal with troubles of the cooling devices because the auxiliary cooling device and the main cooling device are independently controlled to operate.

The tenth advantage of the cooling control method for communication stations according to the present invention is that it is possible to set the air temperature, introduced into the evaporator of the boiling type cooling device, high, enhance the cooling capability of the boiling type cooling device, and increase the cooling air temperature inside the main cooling device, whereby the moisture condensation in the casing can be prevented.

The eleventh advantage of the cooling control method for communication stations according to the present invention is that the energy can be saved while maintaining the cooling effect inside the casing.

The twelfth advantage of the cooling control method for communication stations according to the present invention is that the capability of the natural circulation refrigerating circuit can be expansively used by adopting a fan providing a high airflow path as the common fan.

The thirteenth advantage of the cooling control method for communication stations according to the present invention is that bypassing and short cycles do not occur in the casing, a high cooling efficiency is realized, and therefore the energy can be saved.

The fourteenth advantage of the cooling control method for communication stations according to the present invention is that troubles in the forced circulation refrigerating circuit, caused at time of directly sucking a heat air, can be prevented.

The fifteenth advantage of the cooling control method for communication stations according to the present invention is that the air conditioner indoor unit for the forced circulation refrigerating circuit can be used without modification when the common airflow path is formed and the common fan is located in the airflow path on the evaporator side.

The sixteenth advantage of the cooling control method for communication stations according to the present invention is that the cooler of the natural circulation refrigerating circuit on the use side can be used without modification when the common fan is located in the airflow path on the cooler side.

The seventeenth advantage of the cooling control method for communication stations according to the present invention is that an unnecessary running cost for the forced circulation refrigerating circuit can be saved.

The eighteenth advantage of the cooling control method for communication stations according to the present invention is that the troubles in the forced circulation refrigerating circuit can be rapidly solved without an abrupt increment of the temperature in the casing.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Applications JP11-219661 filed on Aug. 3, 1999, JP11-239406 filed on Aug. 26, 1999 and JP12-014583 filed on Jan. 24, 2000 including specification, claims, drawings and summary are incorporated herein by reference in its entirety.

What is claimed is:

1. A cooling controlling method for a communication station having an air conditioner, formed by connecting a compressor, an outdoor heat exchanger, a depressurizing mechanism, an indoor heat exchanger, and others, and a casing for accommodating communication equipments, having built-in heat components such as a boards, comprising:
   an electric power detecting means for detecting a power consumption of the communication equipments, accommodated in the casing;
   a suction temperature detecting means for detecting a temperature of an air, sent to the communication equipments; and
   a cooling control means for controlling a capability of the air conditioner,
   wherein the cooling control means controls the capability of the air conditioner, based on an output from the electric power detecting means and an output from the suction temperature detecting means.

2. The cooling control method for the communication station according to claim 1,
   wherein the capability the compressor of the air conditioner is minimized in case that the output from the electric power detecting means is smaller than a predetermined electrical power.

3. The cooling control method for a communication station according to claim 1, further comprising:
   a suction temperature detecting means for detecting a suction temperature into the indoor heat exchanger,
   wherein the capability of the air conditioner is controlled also based on an output from the suction temperature detecting means for the indoor heat exchanger by the cooling control means.

4. The cooling control method for the communication station according to claim 3,
   wherein a capability of the compressor of the air conditioner is minimized in case that an output from the electric power detecting means is smaller than a predetermined electrical power, or an output from the suction temperature detecting means for the indoor heat exchanger is smaller than a predetermined temperature.

5. The cooling control method for the communication station according to claim 1,
   wherein the electric power consumption is detected by the electrical power detecting means based on a total electric current through the communication equipments, accommodated in the casing.

6. The cooling control method for a communication station according to claim 3,
   wherein the cooling control means controls the capability of the air conditioner based also on a control target value of a temperature of an air, sent to the communication equipments, and changes the control target value of the temperature of the air, sent to the communication equipments, based on an output from the suction temperature detecting means for the indoor heat exchanger.

7. The cooling control method for the communication station according to claim 6,
   wherein the cooling control means changes the control target value of the temperature of the air, sent to the communication equipments, based on a target value of the suction air temperature into the indoor heat exchanger and an output from the suction temperature detecting means for the indoor heat exchanger, and
   the cooling control means decreases the target value of the suction air temperature into the indoor heat exchanger by a predetermined temperature in case that at least one of phenomenons that the suction temperature into the communication equipments, detected by the suction temperature detecting means for the communication equipments, exceeds a predetermined limit value and that the air conditioner is turned on for predetermined times or more.

8. The cooling control method for the communication station according to claim 7,
   wherein an upper limit value and a lower limit value of the suction air temperature are controlled by the cooling control means based on the target value of the suction air temperature for the indoor heat exchanger and the control target value of the temperature of the air, sent to the communication equipments.

9. The cooling control method for the communication station according to claim 6,
   wherein an initial value of the control target value is set by the cooling control means by every predetermined period.

10. The cooling control method for the communication station according to claim 6, further comprising:
    an auxiliary cooling device in addition to the air conditioner, served as a main cooling device,
    wherein an operation of the auxiliary cooling device is controlled independently of the main cooling device.

11. The cooling control method for the communication station according to claim 6, further comprising:
    a boiling-type cooling device as an auxiliary cooling device in addition to the air conditioner, served as a main cooling device; and
    an evaporator for the boiling-type cooling device located on an upstream side in an airflow path, in which the indoor heat exchanger of the main cooling device is located,
    wherein the main cooling device controls to cool an air, cooled by the boiling-type cooling device.

12. The cooling control method for the communication station according to claim 11, wherein a blower of an outdoor unit of the boiling-type cooling device is stopped in case that the detected temperature by the suction temperature detecting means for the indoor heat exchanger is smaller than a predetermined value.

13. The cooling control method for the communication station according to claim 3, wherein the cooling control means controls to minimize the cooling capability of the air conditioner in case that the electric power consumption of the communication equipments, outputted from the electric power detecting means, is a predetermined value or less.

14. The cooling control method for communication station according to claim 3, wherein the cooling control means controls to minimize the cooling capability of the air conditioner in case that the suction temperature into the indoor unit, outputted from the suction temperature detecting means for the indoor unit is a predetermined value or less.

* * * * *